US010103244B2

United States Patent
Prabhakar et al.

(10) Patent No.: US 10,103,244 B2
(45) Date of Patent: Oct. 16, 2018

(54) DRAIN EXTENDED MOS TRANSISTORS WITH SPLIT CHANNEL

(71) Applicant: Cypress Semiconductor Corporation, San Jose, CA (US)

(72) Inventors: Venkatraman Prabhakar, Pleasanton, CA (US); Igor Kouznetsov, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 80 days.

(21) Appl. No.: 15/045,608

(22) Filed: Feb. 17, 2016

(65) Prior Publication Data
US 2016/0247897 A1 Aug. 25, 2016

Related U.S. Application Data

(63) Continuation of application No. 14/494,917, filed on Sep. 24, 2014.
(Continued)

(51) Int. Cl.
*H01L 21/336* (2006.01)
*H01L 29/66* (2006.01)
(Continued)

(52) U.S. Cl.
CPC .. *H01L 29/66598* (2013.01); *H01L 21/26586* (2013.01); *H01L 21/823814* (2013.01);
(Continued)

(58) Field of Classification Search
CPC .......... H01L 29/7835; H01L 29/66659; H01L 21/26586; H01L 29/7816; H01L 29/1045;
(Continued)

(56) References Cited

U.S. PATENT DOCUMENTS 5,516,711 A 5/1996 Wang
5,731,619 A * 3/1998 Subbanna ....... H01L 21/823892
257/374
(Continued)

FOREIGN PATENT DOCUMENTS

CN 102097485 A 6/2011

OTHER PUBLICATIONS

Chatterjee Amitabh, Physics of Optimized High Current ESD Performance of Drain Extended NMOS (De-NMOS), SISPAD 2012, Sep. 5-7, 2012, Denver, CO.
(Continued)

*Primary Examiner* — David Chen

(57) ABSTRACT

A method of making a semiconductor device is provided. The method includes forming a deep well (DWELL) and a well (WELL) in a first region of a substrate, the WELL adjacent a surface of the substrate so that an interface between the WELL and DWELL is exposed on the surface of the substrate. A channel for a DEMOS transistor is formed in the first region over the interface and includes a first channel formed in the WELL and a second channel formed in the DWELL. A gate layer is deposited and patterned to concurrently form in the first region a first gate for the DEMOS transistor and in a second region a second gate for an ESD device. Dopants are implanted in the first and second regions to concurrently form a drain extension of the DEMOS transistor, and an ESD diffusion region of the ESD device.

16 Claims, 17 Drawing Sheets

Related U.S. Application Data

(60) Provisional application No. 61/925,958, filed on Jan. 10, 2014.

(51) Int. Cl.

| | | |
|---|---|---|
| *H01L 29/78* | (2006.01) | |
| *H01L 29/10* | (2006.01) | |
| *H01L 21/265* | (2006.01) | |
| *H01L 21/8238* | (2006.01) | |
| *H01L 27/02* | (2006.01) | |
| *H01L 27/092* | (2006.01) | |
| *H01L 29/792* | (2006.01) | |

(52) U.S. Cl.
CPC ........... *H01L 21/823878* (2013.01); *H01L 21/823892* (2013.01); *H01L 27/0259* (2013.01); *H01L 27/0266* (2013.01); *H01L 27/0922* (2013.01); *H01L 29/1045* (2013.01); *H01L 29/66659* (2013.01); *H01L 29/66833* (2013.01); *H01L 29/7835* (2013.01); *H01L 29/792* (2013.01); *H01L 29/7816* (2013.01); *H01L 29/7833* (2013.01)

(58) Field of Classification Search
CPC ........... H01L 29/1095; H01L 29/66681; H01L 21/823412
USPC .......... 257/336, E21.417, E21.427, E29.256, 257/E29.266, E29.268; 438/262, 286, 438/302
See application file for complete search history.

(56) References Cited

U.S. PATENT DOCUMENTS

| | | | |
|---|---|---|---|
| 5,897,348 A * | 4/1999 | Wu .................... | H01L 27/0266 257/E21.622 |
| 6,022,778 A * | 2/2000 | Contiero ......... | H01L 21/823456 257/E21.417 |
| 7,262,471 B2 | 8/2007 | Pan et al. | |
| 7,427,795 B2 | 9/2008 | Pendharkar | |
| 7,592,661 B1 | 9/2009 | Lee et al. | |
| 7,838,937 B1 | 11/2010 | Walker et al. | |
| 8,111,558 B2 | 2/2012 | Pesavento et al. | |
| 8,264,038 B2 | 9/2012 | Pendharkar et al. | |
| 8,283,727 B1 | 10/2012 | Walker et al. | |
| 8,304,303 B2 | 11/2012 | Pendharkar | |
| 8,575,702 B2 | 11/2013 | Cha et al. | |
| 2003/0038316 A1* | 2/2003 | Tsuchiko ............ | H01L 29/7816 257/324 |
| 2003/0141559 A1* | 7/2003 | Moscatelli ........ | H01L 21/28167 257/406 |
| 2006/0145250 A1* | 7/2006 | Ma ...................... | H01L 29/0634 257/336 |
| 2006/0220120 A1* | 10/2006 | Horch ................. | H01L 29/0634 257/341 |
| 2007/0034985 A1 | 2/2007 | Matsudai et al. | |
| 2008/0160706 A1 | 7/2008 | Jung | |
| 2010/0032749 A1 | 2/2010 | Shrivastava et al. | |
| 2010/0052052 A1* | 3/2010 | Lotfi ................. | H01L 21/28518 257/336 |
| 2010/0176449 A1* | 7/2010 | Matsudai ............ | H01L 21/2652 257/335 |
| 2011/0266614 A1 | 11/2011 | Khan et al. | |
| 2012/0193711 A1* | 8/2012 | Asano ................. | H01L 27/0262 257/343 |
| 2012/0228704 A1 | 9/2012 | Ju | |
| 2013/0001686 A1* | 1/2013 | Kim ....................... | H01L 29/78 257/336 |
| 2013/0181287 A1 | 7/2013 | Zhang et al. | |
| 2013/0320397 A1* | 12/2013 | Sze ................... | H01L 29/66325 257/141 |
| 2015/0187938 A1* | 7/2015 | Tang .................. | H01L 29/7836 257/369 |

OTHER PUBLICATIONS

International Search Report for International Application No. PCT/US15/10516 dated Apr. 13, 2015; 2 pages.
Salman A.A. Engineering optimal high current characteristics of high voltage DENMOS, Reliability Physics Symposium (RPS). IEEE International, Apr. 15-19, 2012, pp. 3, Anaheim, CA.
USPTO Advisory Action for U.S. Appl. No. 14/494,917 dated Jan. 6, 2016; 3 pages.
USPTO Final Rejection for U.S. Appl. No. 14/494,917 dated Oct. 20, 2015; 12 pages.
USPTO Non-Final Rejection for U.S. Appl. No. 14/494,917 dated Jun. 12, 2015; 13 pages.
USPTO Restriction Requirement for U.S. Appl. No. 14/494,917 dated Mar. 19, 2015; 6 pages.
Written Opinion of the International Searching Authority for International Application No. PCT/US15/10516 dated Apr. 13, 2015; 6 pages.
SIPO Office Action for Application No. 201580003146.4 dated Jan. 24, 2018; 7 pages.

* cited by examiner

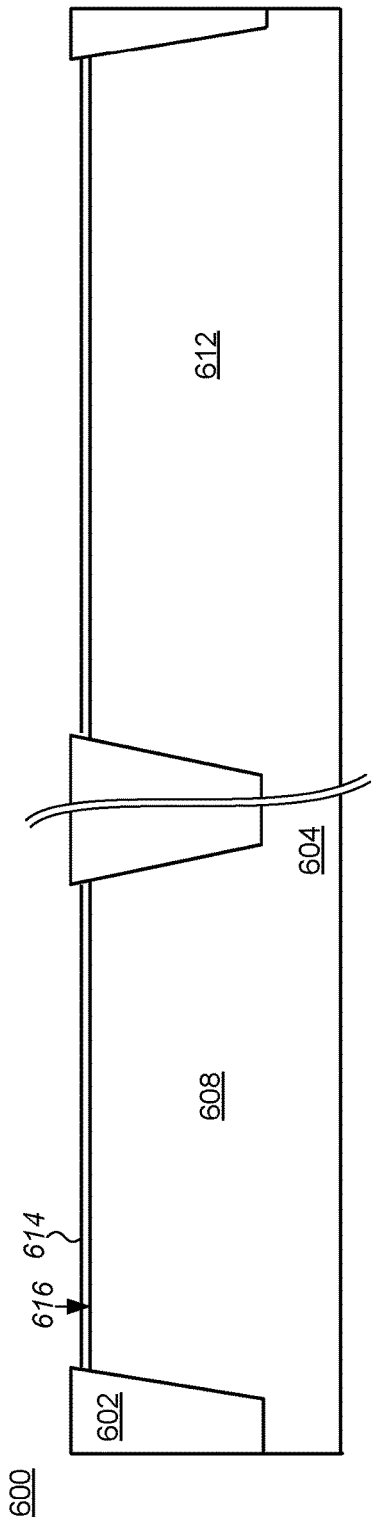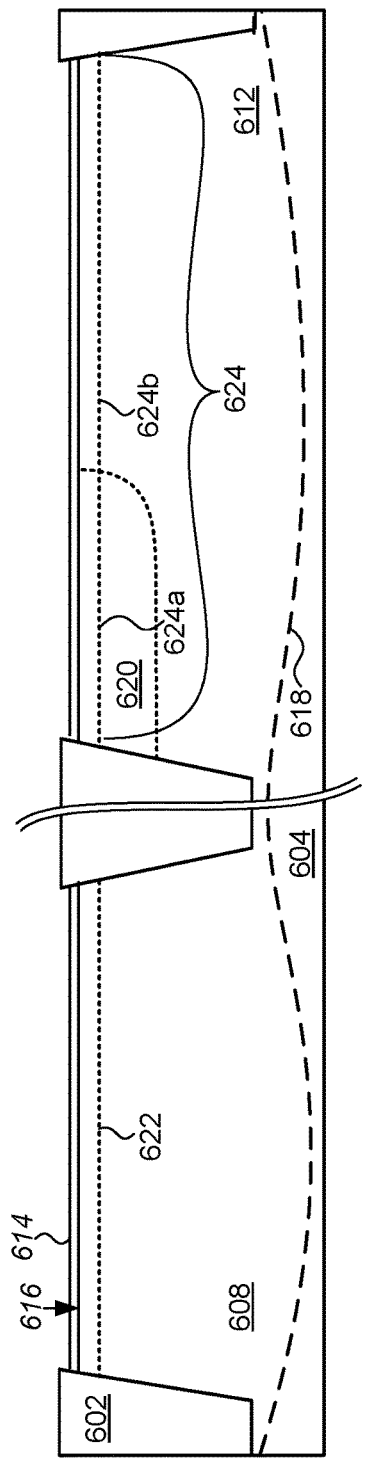

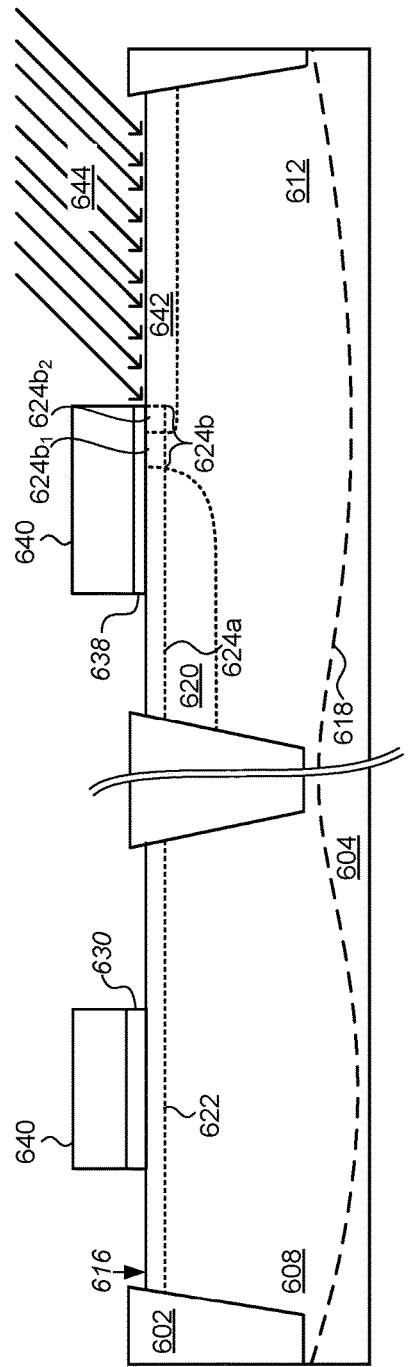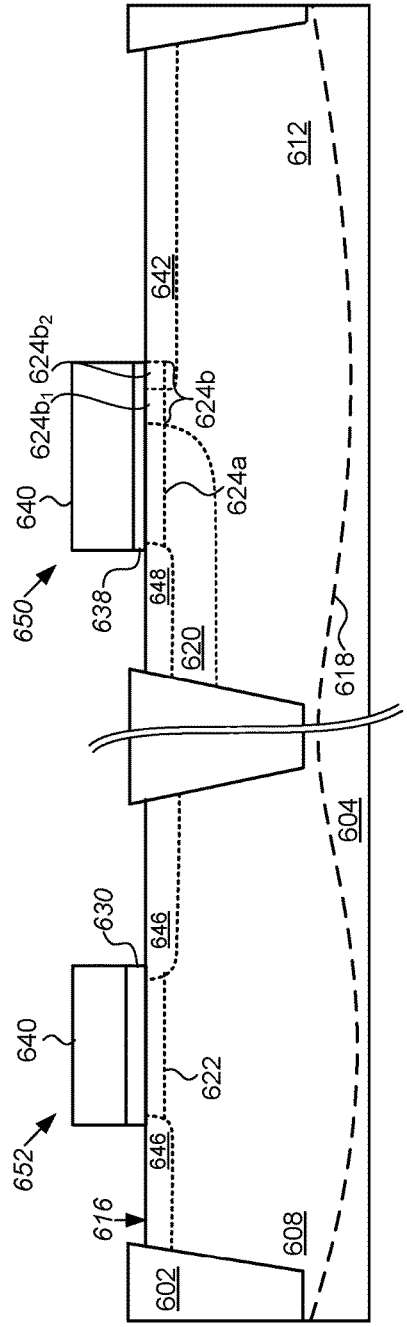

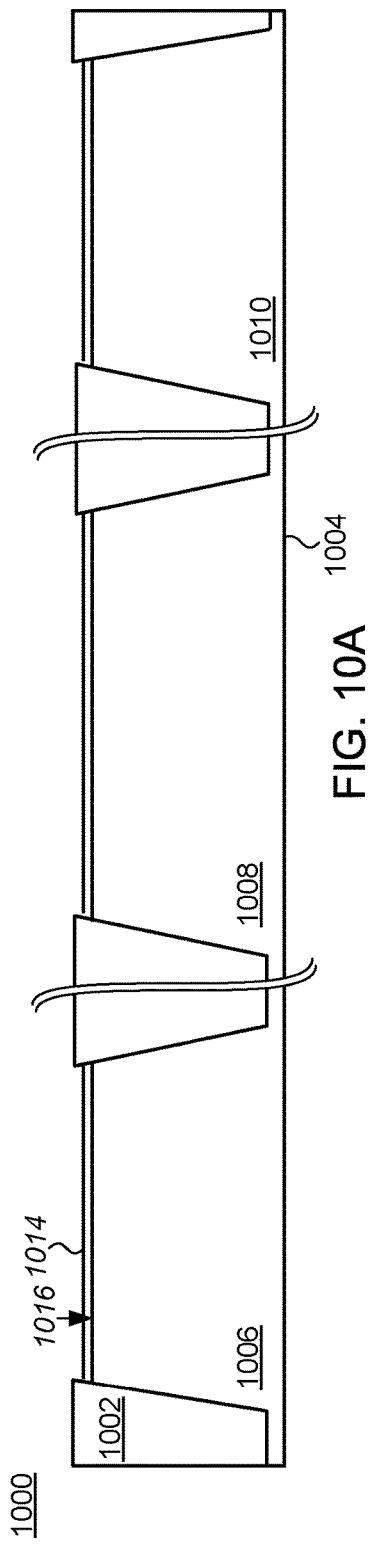
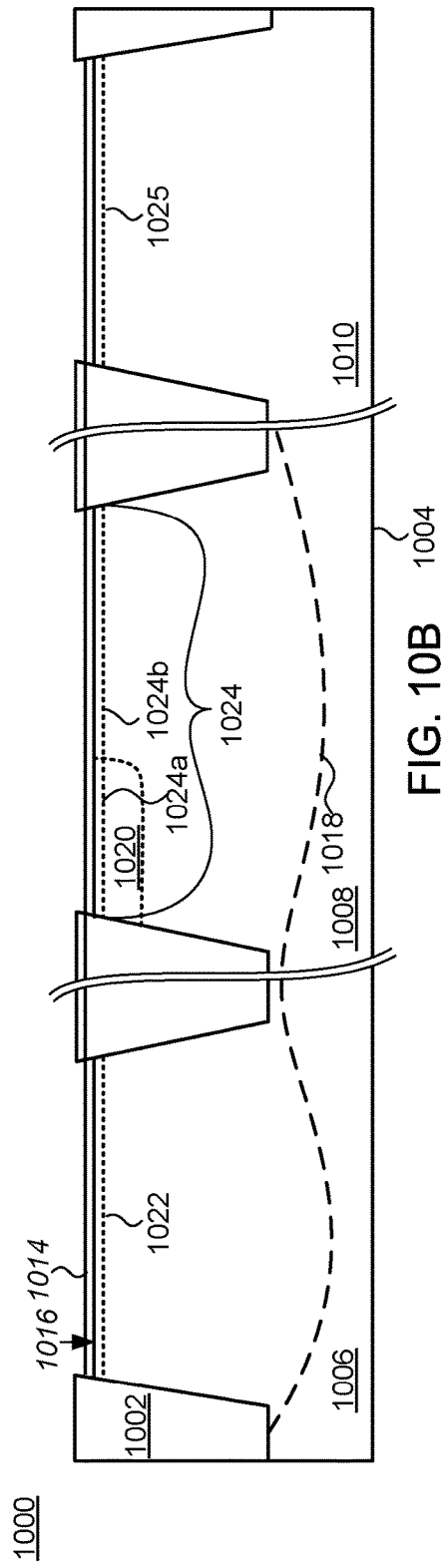
FIG. 10A
FIG. 10B

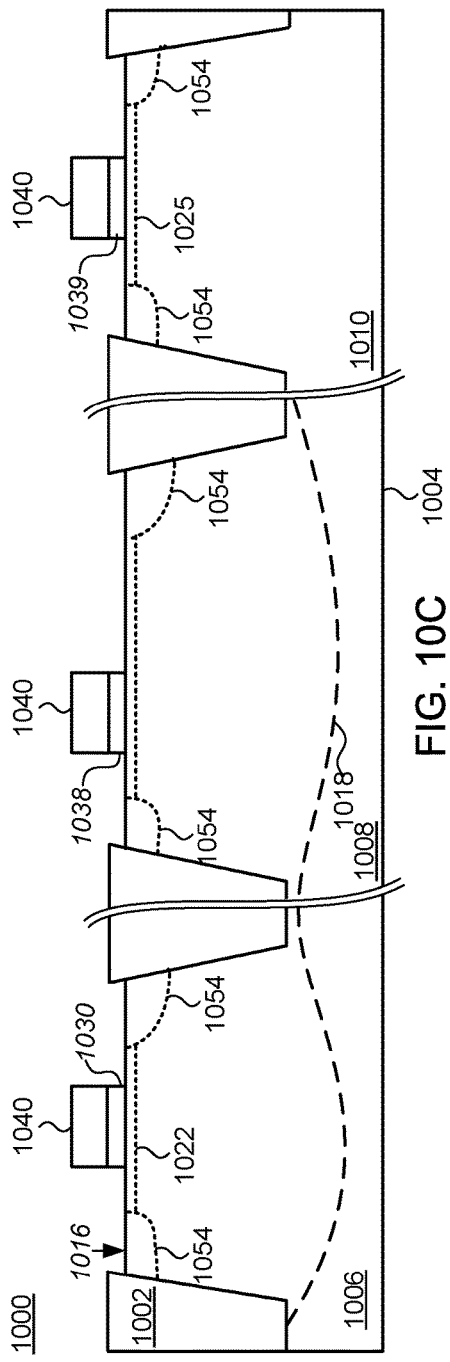
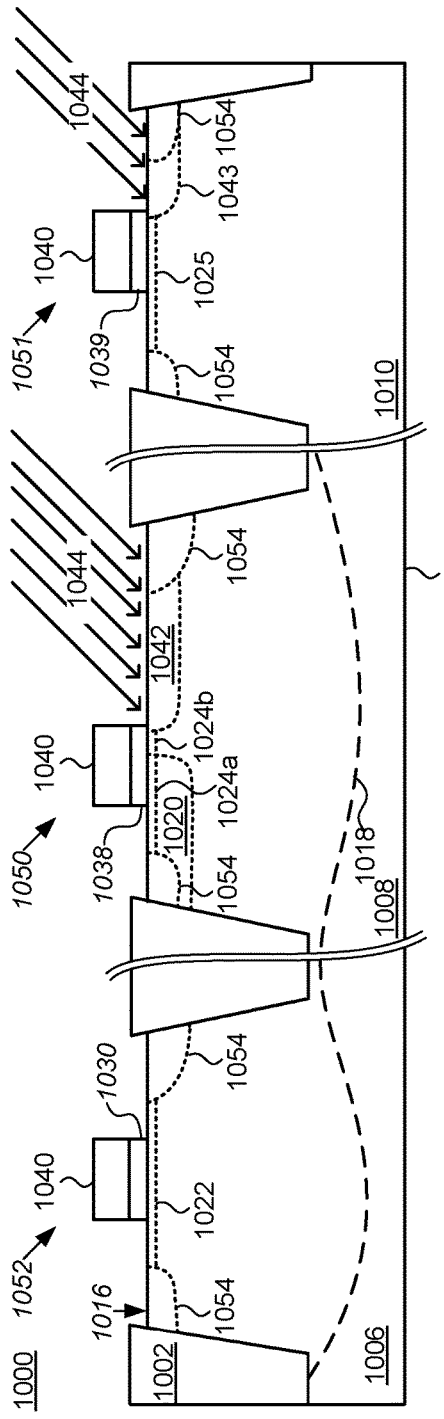

DRAIN EXTENDED MOS TRANSISTORS WITH SPLIT CHANNEL

CROSS-REFERENCE TO RELATED APPLICATIONS

This application is a continuation of co-pending U.S. application Ser. No. 14/494,917, filed Sep. 24, 2014, which claims the benefit of priority under 35 U.S.C. 119(e) to U.S. Provisional Patent Application Ser. No. 61/925,958, filed Jan. 10, 2014, which is incorporated by reference herein in its entirety.

TECHNICAL FIELD

This disclosure relates generally to fabrication of semiconductor devices, and more particularly to drain extended metal-oxide-semiconductor (DEMOS) transistors with split channels integrally fabricated using existing complimentary metal-oxide-semiconductor (CMOS) processes and suitable for use in high-voltage (HV) circuits of devices such as Non-Volatile Memories (NVM).

BACKGROUND

While many types of integrated circuits may be designed to operate with a single internal voltage, it is often desirable to provide an integrated circuit (IC) including devices (e.g., transistors as well as passive circuit elements) that operate at two or more different voltage levels. Examples of such ICs include a Non-Volatile Memories (NVM) and ICs including a NVM or a flash macro or memory, such as a microcontroller, microprocessor or programmable system on a chip (PSOC). Such a circuit typically includes low-voltage metal-oxide-semiconductor (LV_MOS) transistors used in logic and/or switching applications and designed to operate at a voltage of less than from about 2.5 to about 3.3 volts (V), and other high-voltage metal-oxide-semiconductor (HV_MOS) transistors used in NVM applications such as charge pumps, HV switches, sector selectors, input/output (I/O) cells or drivers, and typically designed to operate at voltages of about 9V or greater.

One approach to integrating a HV_MOS transistor into such a circuit includes introducing drain-extended (DE) architectures to provide transistors having higher breakdown voltages (BV) for use in high power and high voltage applications. Briefly, in a DE transistor the drain is extended by implanting low doped semiconductor region which depletes during reverse biasing, thereby allowing much of voltage to be dropped across a drain extension in the substrate, and thereby reducing the electric field across a gate oxide to a safe level. In existing complementary metal-oxide-semiconductor (CMOS) process flows the DE implants are done using masks and implants borrowed from other devices in baseline process. However, as the size of the transistors advance to less than 65 nanometers (nm) many of these masks and implants are not used. Instead, only well masks are used (including both deep and shallow implants) and halo/tip implants are used control a threshold voltage ($V_T$) of the transistor.

Thus, there is a need for a method of forming DEMOS transistors with a high BV that is compatible with process flows fabricating transistors at 65 nm and beyond. It is further desirable that the method substantially does not introduce any new mask and/or implant steps to the process flow.

SUMMARY

Methods of forming circuits including non-volatile memory (NVM) devices, low-voltage metal-oxide-semiconductor (LV_MOS) devices and high-voltage, drain extended metal-oxide-semiconductor (DEMOS) devices and methods of manufacturing the same are described. In one embodiment, the DEMOS device includes a first channel, a gate, a second channel, and a drain extension, wherein the second channel is split into a first portion and a second portion, and wherein the first portion of the second channel stops under the gate and is spaced away from the drain extension.

BRIEF DESCRIPTION OF THE DRAWINGS

Embodiments of the present invention will be understood more fully from the detailed description that follows and from the accompanying drawings and the appended claims provided below, where:

FIGS. 6A-6K are block diagrams illustrating cross-sectional views of a part of the circuit formed by the method of the flowchart of FIG. 5;

FIGS. 10A-10D are block diagrams illustrating cross-sectional views of a part of the circuit formed by the method of the flowchart of FIG. 9.

DETAILED DESCRIPTION

Figure 1A:
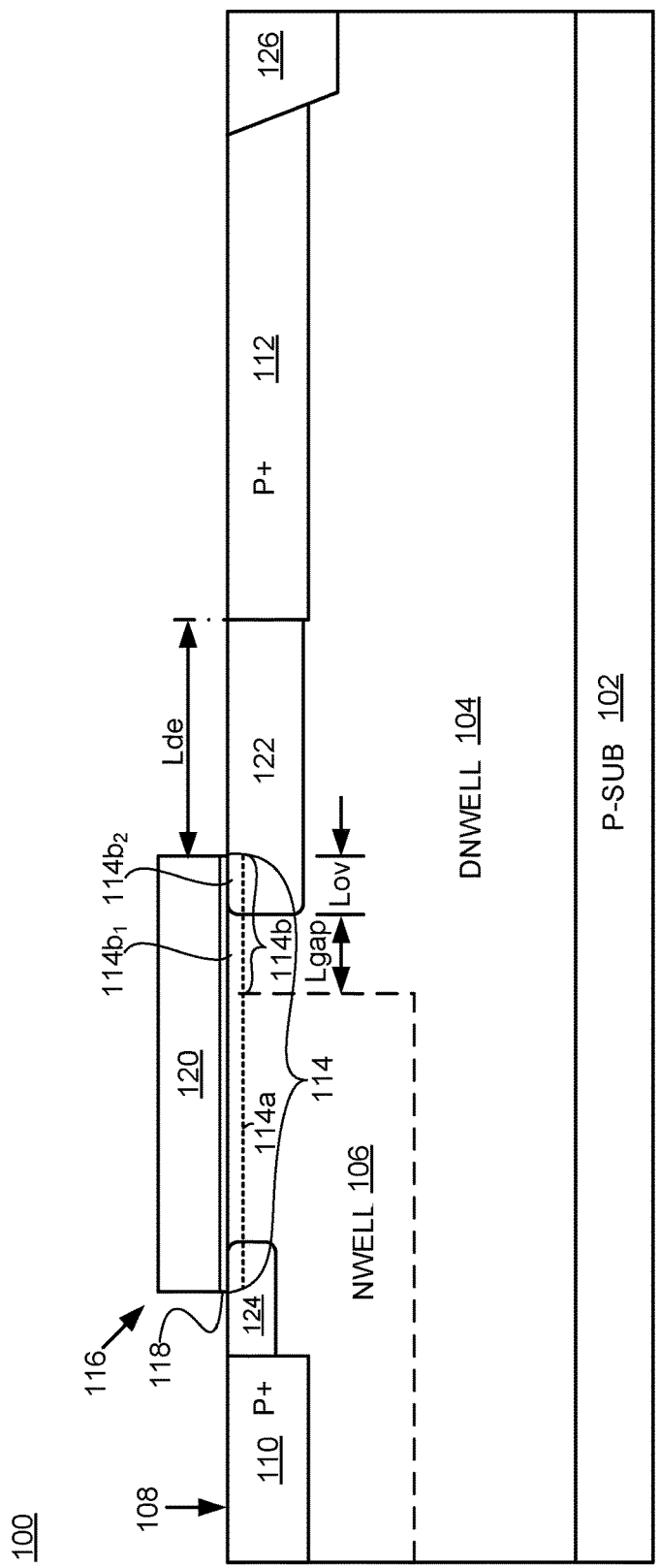
FIG. 1A is a block diagram illustrating a cross-sectional view of an embodiment of a drain-extended P-type MOS (DEPMOS) transistor or device including a N-type well (NWELL) stopping under a gate of the DEPMOS transistor.

The present disclosure is directed generally to drain-extended metal-oxide-semiconductor (DEMOS) transistors and methods for fabricating the same.

Various embodiments of the DEMOS transistors and methods for fabricating the same will now be described with reference to a number of diagrams. The embodiments include methods of concurrently forming a DEMOS transistor, as well as a low-voltage or regular metal-on-semiconductor (MOS) transistor, and a non-volatile memory (NVM) transistor on a single substrate for a number of different circuits and applications. In particular embodiments, the DEMOS transistor may be integrally formed in the same substrate as a NVM transistor and a LV_MOS transistor in an input/output (I/O) cell, or in a driver for the NVM device.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Drain-extended high voltage transistors are useful in applications in which it is desirable to provide higher drain breakdown voltages (BV) across the transistor, and/or in applications in which it is desirable to reduce the amount of voltage dropped across a gate to drain extension edge. Preferably, the transistors and method of present disclosure enable high drain voltage operation without modifying existing processes and device architectures, such as gate oxide thicknesses. More preferably, the DEMOS transistors are fabricated as part of a complimentary-metal-oxide-semiconductor circuit including low-voltage or regular MOS transistors, and NVM transistors fabricated simultaneously on the same semiconductor substrate or wafer using existing CMOS processes.

Figure 1B:
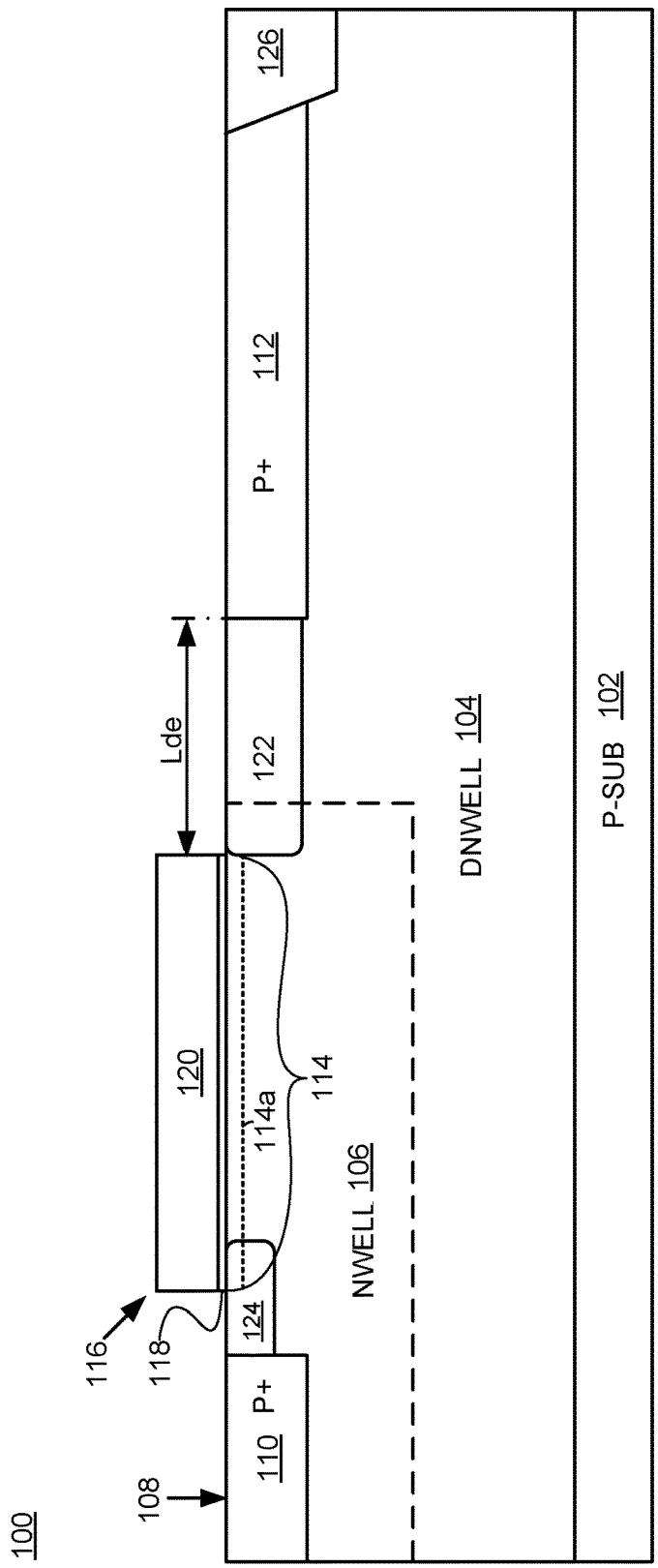
FIG. 1B is a block diagram illustrating a cross-sectional view of another embodiment of a DEPMOS transistor including a NWELL stopping proximal to an edge of the gate of the DEPMOS transistor.
Figure 2:
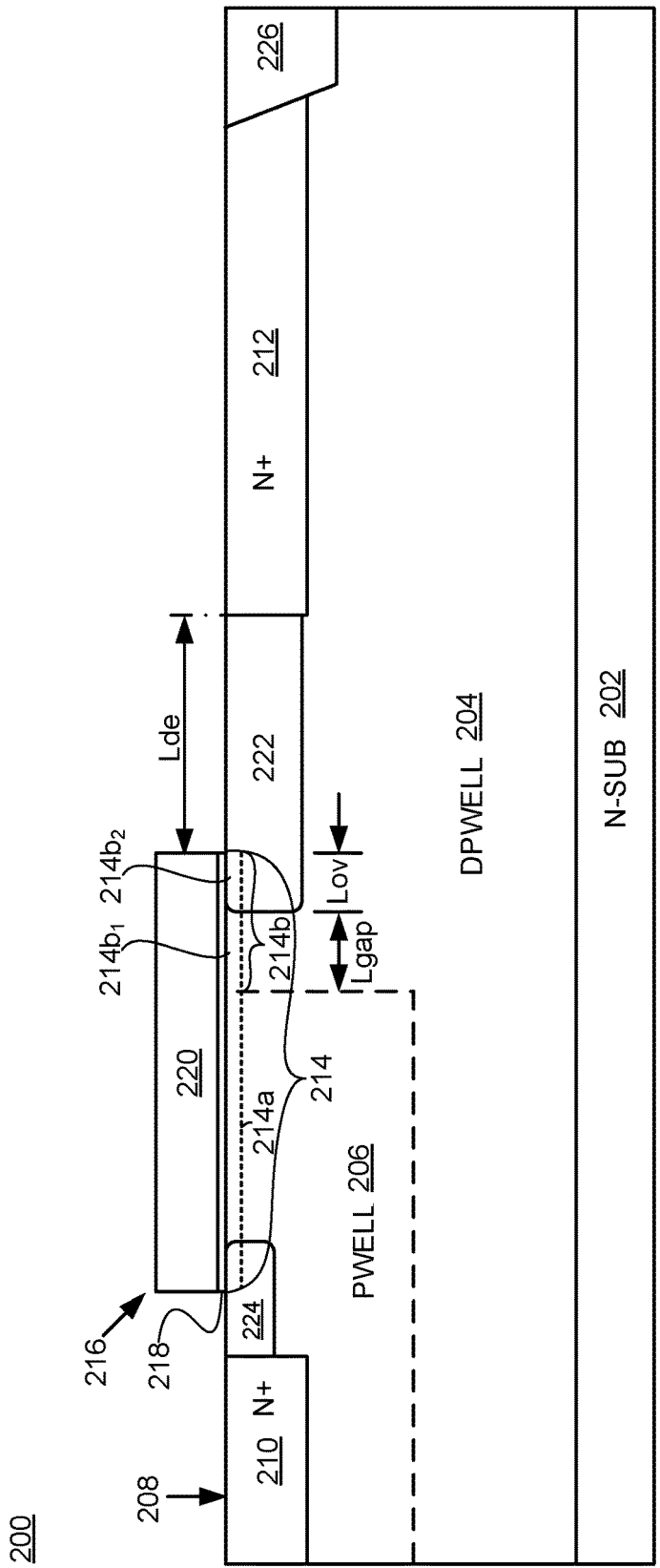
FIG. 2 is a block diagram illustrating a cross-sectional view of an embodiment of a drain-extended N-type MOS (DENMOS) transistor including an PWELL stopping under a gate of the DENMOS transistor.

DEMOS transistors according to various embodiments of the present disclosure will now be described in greater detail with reference to FIGS. 1A to 2. In particular, FIG. 1A is a block diagram illustrating a cross-sectional view of an embodiment of a drain-extended P-type MOS (DEPMOS) transistor or device including P-type channel (P-channel) and a N-type well (NWELL) in a deep NWELL (DNWELL), in which an interface between the NWELL and the DNWELL near a surface of the substrate stopping under a gate stack of the DEPMOS transistor. FIG. 1B is a block diagram illustrating a cross-sectional view of another embodiment of a DEPMOS transistor in which the interface between the NWELL and the DNWELL stops proximal to an edge of the gate stack of the DEPMOS transistor. FIG. 2 is a block diagram illustrating a cross-sectional view of an embodiment of a drain-extended N-type MOS (DENMOS) transistor including a PWELL in a deep PWELL (DPWELL), in which an interface between the PWELL and the DPWELL near a surface of the substrate stops under a gate stack of the DENMOS transistor.

Referring to FIG. 1A, the DEPMOS transistor 100 is formed in a semiconductor wafer or substrate 102. The substrate 102 may include any known semiconductor material, such as Silicon, Gallium-arsenide, Germanium, Gallium-nitride, Aluminum-phosphide, and mixtures or alloys thereof. Preferably, the substrate 102 is a doped silicon-based semiconductor substrate, such as a P-type silicon substrate (P-substrate).

The DEPMOS transistor 100 includes or is formed in a deep well implanted with a N-type dopant to form a deep NWELL or DNWELL 104. The dopants implanted may be of any suitable N-type dopant, implanted at any energy and to any concentration suitable to form a DNWELL for the DEPMOS transistor 100. For example, in one particular embodiment, phosphorus ions are implanted at a relatively high energy of between about 800 keV and about 1.5 MeV and to a concentration or dose of between about $0.5E13/cm^2$ and about $5E13/cm^2$ to form a lightly doped DNWELL.

The DEPMOS transistor 100 further includes a more heavily doped NWELL 106 formed in the DNWELL 104 near a surface 108 of the substrate 102 by implantation of a N-type dopant, such as arsenic or phosphorus ions, to a concentration or dose greater than that of the lightly doped DNWELL 104. For example, in one particular embodiment, the NWELL 106 includes phosphorus ions implanted at a relatively low energy of between about 250 keV and about 500 keV and to a concentration or dose of between about $1E13/cm^2$ and about $7E13/cm^2$ to form the NWELL.

The DEPMOS transistor 100 further includes a heavily doped P+ source 110 and a heavily doped P+ drain 112 separated by a MOS channel region or channel 114 underlying a gate stack 116 including gate oxide 118 and a polycrystalline silicon (poly) or metal gate electrode 120. By heavily doped it is meant a concentration of suitable impurities or dopant ions, such as boron ions ($B^+$) of from about $1E15/cm^2$ to about $5E15/cm^2$, as compared to the dopant concentration in the NWELL 106 and DNWELL 104.

In accordance with the present disclosure, the DEPMOS transistor 100 further includes a drain extension 122 between the channel 114 and the drain 112 through which the drain is electrically connected to the channel. The distance or length between an edge of the gate stack 116, which coincides with the beginning of the channel 114, and the drain 112 is referred to as the length of the drain extension 122 or $L_{DE}$. Suitable distances or lengths for the $L_{DE}$ include from about 400 to about 1,000 nm. Generally, the drain extension 122 of a DEPMOS transistor 100 is formed by implanting or diffusing a P-type dopant, such as B+, into the surface 108 of the substrate 102 to achieve depletion during reverse bias across the drain/DWELL junction, thereby achieving a high junction breakdown or BV. The drain extension 122 is more lightly doped than the highly doped drain 112 so that during reverse bias depletion regions formed in the channel 114 can extend far enough to reduce the electric field per unit length and achieve a high breakdown voltage or BV towards the substrate region. Thus, the lightly doped drain extension 122 gets depleted during reverse biasing to drop most of the voltage applied to the drain 112 of the high voltage DEPMOS transistors 100.

For example, a lightly doped drain extension 122 can include a concentration of boron ions (B$^+$) of from about $0.5E13/cm^2$ to about $3E13/cm^2$, as compared to the dopant concentration in highly doped drain 112. It has been found that with such a lightly doped drain extension 122 an applied drain voltage of about 9 to 10 volts, approximately 6 volts can be dropped across the drain extension 122, thereby limiting voltage across the gate oxide to about 3.6V, and enabling use of a standard low I/O voltage gate oxide 118 as isolation layer between the channel 114 and the gate electrode 120.

In some embodiments, such as that shown in FIG. 1A, the drain extension 122, overlaps the gate stack 116 and is implanted in such a way that the overlap between the drain extension and the gate stack is reduced to trade off an increase in breakdown voltage against a decrease in on-state current for shorter channel length devices. Suitable distances or lengths for the overlap ($L_{OV}$) include from about 50 to about 100 nm.

Optionally, in some embodiments the DEPMOS transistor 100 may further include a lightly doped diffusion (LDD) 124 between the channel 114 and the source 110 through which the source is electrically connected to the channel. As with the drain extension 122, the LDD 124 can be formed either by implanting or diffusing ions of the appropriate dopant species, B+ for the DEPMOS shown, to a suitable concentration and a suitable depth. For example, the LDD 124 can include a concentration of boron ions (B$^+$) of from about $0.5E14/cm^2$ to about $5E14/cm^2$, as compared to the dopant concentration in highly doped source 110, and can extend from edge of the gate stack 116 or the beginning of the channel 114 to the source a distance or length of from about 10 to about 45 nm. Additionally, as with the drain extension 122, in some embodiments the LDD 124 can overlap the gate stack 116 as shown in FIG. 1A, while in other embodiments it is formed in such a way as to end at the edge of the gate stack 116 or the beginning of the channel 114.

Generally, the DEPMOS transistor 100 further includes an isolation structure 126, such as a shallow-trench-isolation (STI) structure, which serves to isolate or separate the DEPMOS transistor from one or more adjacent devices or transistors. Although shown here as a STI structure, it will be appreciated that the isolation structure 126 can also include a field oxidation region or structure (FOX), or a local oxidation of silicon (LOCOS) region or structure.

In accordance with another aspect of the present disclosure shown in FIG. 1A, the DEPMOS transistor 100 includes an interface between the NWELL 106 and the DNWELL 104 near the surface 108 of the substrate 102 that underlies the gate stack 116 of the DEPMOS transistor to split the channel 114 into a first channel 114a encompassed by or within the NWELL and a second channel 114b encompassed by or within the DNWELL. In certain embodiments, such as that shown in FIG. 1A, the second channel 114b is further split into a first portion 114b$_1$ encompassed by or within only the DNWELL 104 and a second portion 114b$_2$ encompassed by or within the drain extension 122 in the DNWELL. The embodiment will enable fabrication of a DEPMOS transistor 100 even with a baseline CMOS process that typically produces low junction BV. The BV of the DEPMOS 100 will be substantially higher than for devices and transistors produced by the baseline process since the drain 112 and the drain extension 122 are in the DNWELL 104 rather than NWELL as in the prior art approach.

In another embodiment, shown in FIG. 1B, the interface between the NWELL 106 and the DNWELL 104 does not underlie the gate stack 116 of the DEPMOS transistor 100, such that substantially the entire channel 114 consists of the first channel 114a encompassed by or within the NWELL 106. It is noted that this embodiment also will still provide a BV of the DEPMOS 100 significantly higher than for a baseline CMOS process since the drain 112 is spaced away from the NWELL 106, although the drain extension 122 remains touching the NWELL.

FIG. 2 is a block diagram illustrating a cross-sectional view of an embodiment of a drain-extended N-type MOS (DENMOS) transistor including a PWELL in a deep PWELL (DPWELL), in which an interface between the PWELL and the DPWELL near a surface of the substrate stops under a gate of the DENMOS transistor.

Referring to FIG. 2, the DENMOS transistor 200 is formed in a semiconductor wafer or substrate 202. As with the DEPMOS transistor 100 described above, the substrate 202 may include any known semiconductor material, such as Silicon, Gallium-arsenide, Germanium, Gallium-nitride, Aluminum-phosphide, and mixtures or alloys thereof. Preferably, the substrate 202 is a doped silicon-based semiconductor substrate, such as a N-type silicon substrate (n-substrate).

The DENMOS transistor 200 includes or is formed in a deep well implanted with a P-type dopant to form a deep PWELL or DPWELL 204. The dopants implanted may be of any suitable P-type dopant, implanted at any energy and to any concentration suitable to form a DPWELL for the DENMOS transistor 200. For example, in one particular embodiment, boron ions (B+) are implanted at a relatively high energy of between about 300 keV and about 650 keV and to a concentration or dose of between about $0.5E13/cm^2$ and about $5 E13/cm^2$ to form a lightly doped DPWELL.

The DENMOS transistor 200 further includes a more heavily doped PWELL 206 formed in the DPWELL 204 near a surface 208 of the substrate 202 by implantation of a P-type dopant, such as boron ions, to a concentration or dose greater than that of the lightly doped DPWELL 204. For example, in one particular embodiment, the PWELL 206 includes B+ ions implanted at a relatively low energy of between about 80 keV and about 400 keV and to a concentration or dose of between about $1E13/cm^2$ and about $7E13/cm^2$ to form the PWELL.

The DENMOS transistor 200 further includes a heavily doped N+ source 210 and a heavily doped N+ drain 212 separated by a channel 214 underlying a gate stack 216 including gate oxide 218 and a polycrystalline silicon (poly) or metal gate electrode 220. By heavily doped it is meant a concentration of suitable impurities or dopant ions, such as arsenic or phosphorous ions of from about $1E15/cm^2$ to about $5E15/cm^2$, as compared to the dopant concentration in the PWELL 206 and DPWELL 204.

In accordance with the present disclosure, the DENMOS transistor 200 further includes a drain extension 222 between the channel 214 and the drain 212 through which the drain is electrically connected to the channel. The distance or length between an edge of the gate stack 216, which coincides with the beginning of the channel 214, and the drain 212 is referred to as the length of the drain extension 222 or $L_{DE}$. Suitable distances or lengths for the $L_{DE}$ include from about 400 to about 1,000 nm. Generally, the drain extension 222 of a DENMOS transistor 200 is formed by implanting or diffusing a N-type dopant, such as arsenic or phosphorous ions, into the surface 208 of the substrate 202 to achieve depletion during reverse bias, thereby achieving a high junction breakdown or BV. The drain extension 222 is more lightly doped than the highly doped drain 212 so that during reverse bias across the N+/DPWELL junction, depletion regions formed in the channel 214 can extend far enough to reduce the electric field per unit length and achieve a high breakdown voltage or BV towards the substrate region. Thus, the lightly doped drain extension 222 gets depleted during reverse biasing to drop most of the voltage applied to the drain 212 of the high voltage DENMOS transistors 200.

For example, a lightly doped drain extension 222 can include a concentration of arsenic or phosphorous ions of from about $0.5E13/cm^2$ to about $3E13/cm^2$, as compared to the dopant concentration in highly doped drain 212. It has been found that with such a lightly doped drain extension 222 an applied drain voltage of about 9 to 10 volts, approximately 6 volts can be dropped across the drain extension 222, thereby limiting voltage across the gate oxide to about 3.6V, and enabling use of a standard low I/O voltage gate oxide 218 as isolation layer between the channel 214 and the gate electrode 220.

In some embodiments, such as that shown in FIG. 2, the drain extension 222, overlaps the gate stack 216 and is implanted in such a way that the overlap between the drain extension and the gate stack is reduced to trade off an increase in breakdown voltage against a decrease in on-state current for shorter channel length devices. Suitable distances or lengths for the overlap ($L_{OV}$) include from about 50 to about 100 nm.

Optionally, in some embodiments the DENMOS transistor 200 may further include a lightly doped diffusion (LDD) 224 between the channel 214 and the source 210 through which the source is electrically connected to the channel. As with the drain extension 222, the LDD 224 can be formed either by implanting or diffusing ions of the appropriate dopant species, arsenic or phosphorous ions for the DENMOS shown, to a suitable concentration and a suitable depth. For example, the LDD 224 can include a concentration of arsenic or phosphorous ions of from about $0.3E14/cm^2$ to about $3E14/cm^2$, as compared to the dopant concentration in highly doped source 210, and can extend from edge of the gate stack 216 or the beginning of the channel 214 to the source a distance or length of from about 10 to about 45 nm. Additionally, as with the drain extension 222, in some embodiments the LDD 224 can overlap the gate stack 216 as shown in FIG. 2, while in other embodiments it is formed in such a way as to end at the edge of the gate stack 216 or the beginning of the channel 214.

Generally, the DENMOS transistor 200 further includes an isolation structure 226, such as a shallow-trench-isolation (STI) structure, which serves to isolate or separate the DENMOS transistor from one or more adjacent devices or transistors. Although shown here as a STI structure, it will be appreciated that the isolation structure 226 can also include a field oxidation region or structure (FOX), or a local oxidation of silicon (LOCOS) region or structure.

In accordance with another aspect of the present disclosure shown in FIG. 2, the DENMOS transistor 200 includes an interface between the PWELL 206 and the DPWELL 204 near the surface 208 of the substrate 202 that underlies the gate stack 216 of the DENMOS transistor to split the channel 214 into a first channel 214a encompassed by or within the PWELL and a second channel 214b encompassed by or within the DPWELL. In certain embodiments, such as that shown in FIG. 2, the second channel 214b is further split into a first portion $214b_1$ encompassed by or within only the DPWELL 204 and a second portion $214b_2$ encompassed by or within the drain extension 222 in the DPWELL. The embodiment will enable fabrication of a DENMOS transistor 200 even with a baseline CMOS process that typically produces low junction BV. The BV of the DENMOS 200 will be substantially higher than for devices and transistors produced by the baseline process since the drain 212 and the drain extension 222 are in the DPWELL 204 rather than PWELL as in the prior art approach.

In another embodiment, not shown, the interface between the PWELL 206 and the DPWELL 204 does not underlie the gate stack 216 of the DENMOS transistor 200, such that substantially the entire channel 214 consists of the first channel 214a encompassed by or within the PWELL 206. It is noted that this embodiment also will still provide a BV of the DENMOS 200 significantly higher than for the baseline process since the drain 212 is spaced away from the PWELL 206, but the drain extension 222 remains touching the PWELL.

Figure 3:
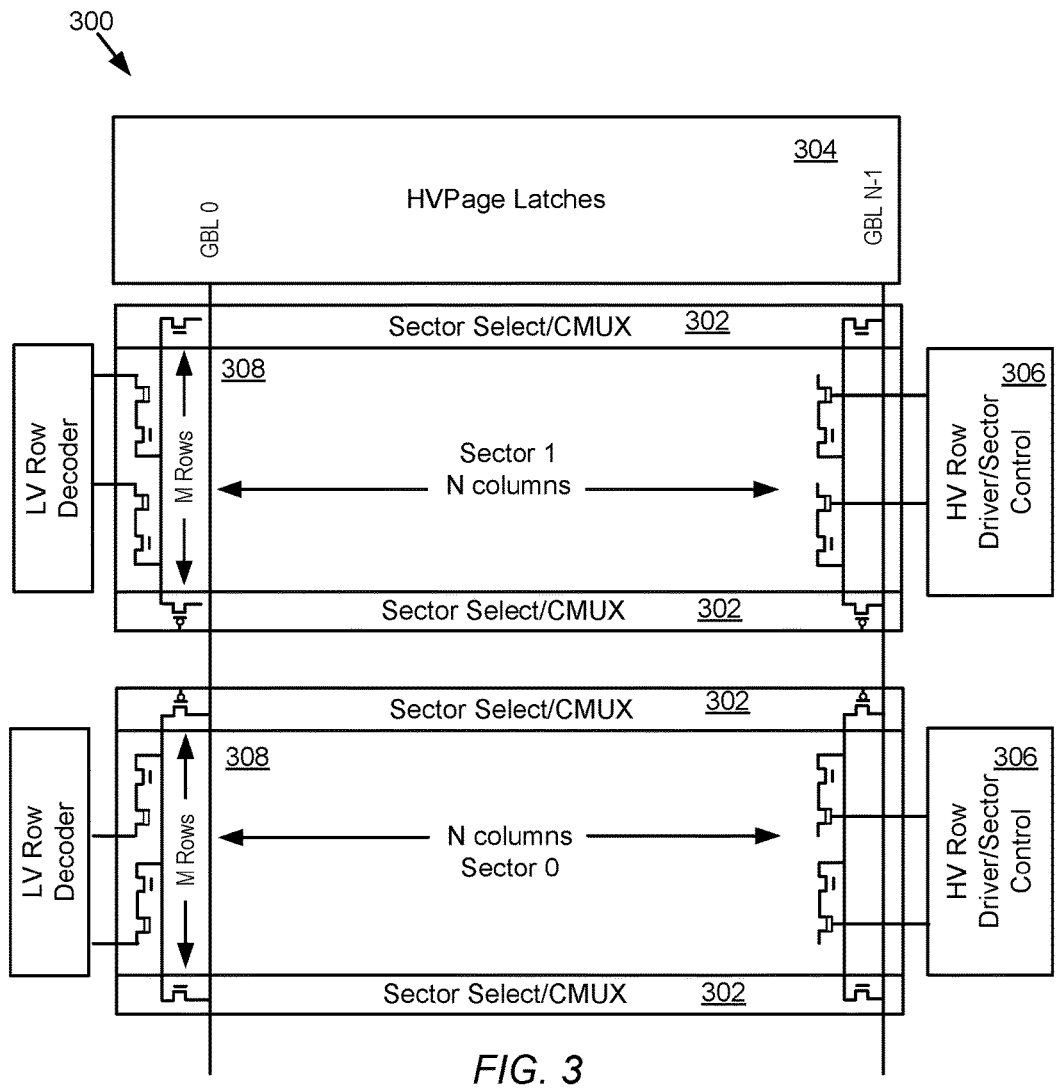
FIG. 3 is a block diagram of a flash macro or memory illustrating applications for a DEPMOS transistor according to embodiments of the present disclosure.

FIG. 3 is a block diagram of a flash memory or flash macro 300 illustrating applications for a DEMOS transistors according to embodiments of the present disclosure. Referring to FIG. 3, it is noted that high voltage DEMOS transistors can be used in at least three separate sub-circuits. In particular, it has been found that HV capabilities of the DEMOS transistors can be advantageously used in HV sector select/CMUXs 302, in HV page latches 304 and in HV row drivers 306. As shown in FIG. 3, the HV page latches 304 include latches coupled to multiple global bit lines (GBL) from GBL 0 to GBL N-1, where N is the number of columns in the flash macro 300. The flash macro 300 further includes multiple sectors 308, only two of which are shown, each having a width of N columns and coupled to HV sector select/CMUXs 302, HV page latches 304 and HV row drivers 306.

Figure 4:
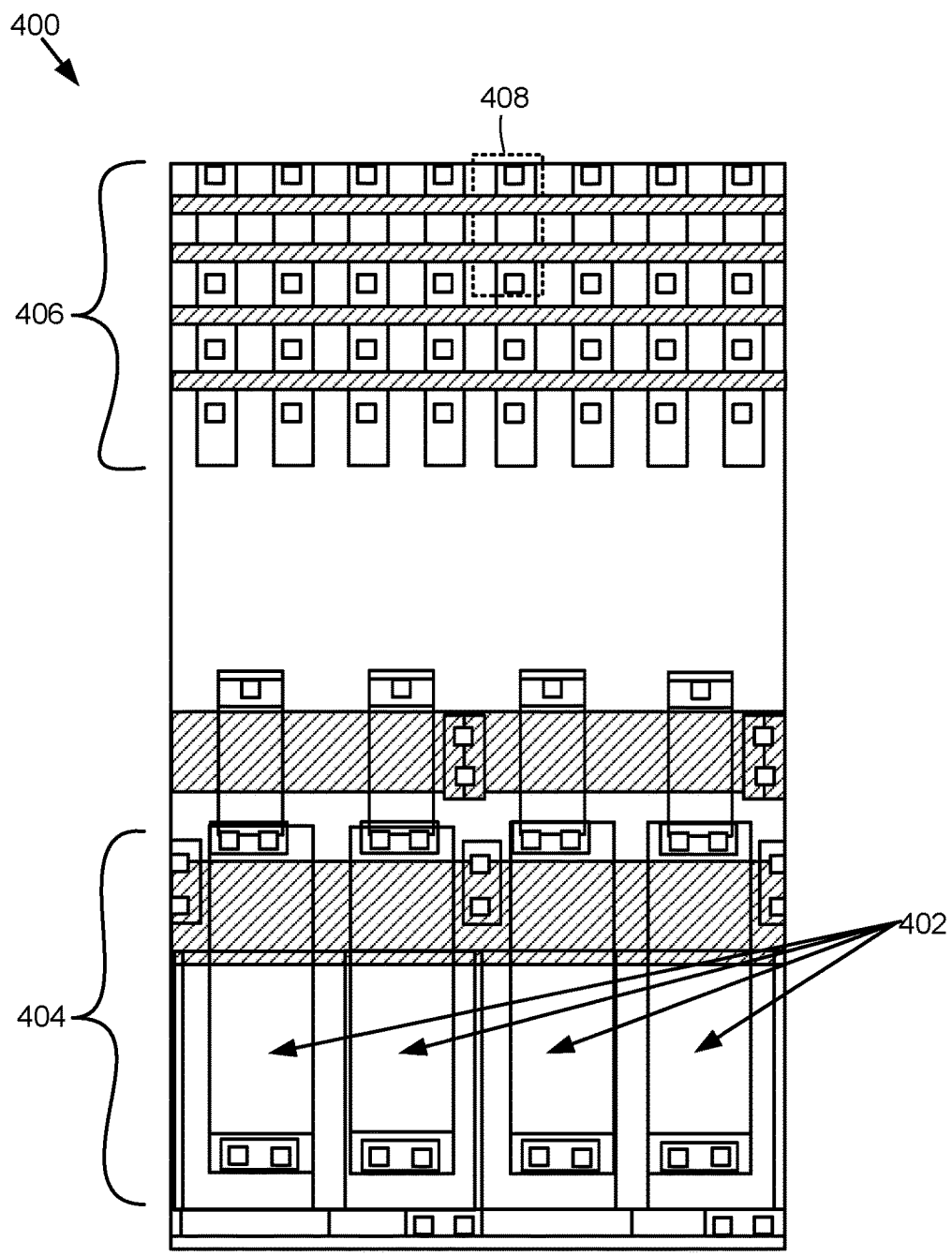
FIG. 4 is a block diagram of a part of a NVM illustrating applications for a DEPMOS transistor in both a memory array and a bit line driver according to embodiments of the present disclosure.

FIG. 4 is a layout of a part of a NVM 400 illustrating applications for a DEMOS transistor 402 according to embodiments of the present disclosure in a bit line driver 404. The bit line driver 404 is laid out on-pitch with a memory array 406 including a plurality of cells 408.

Figure 5:
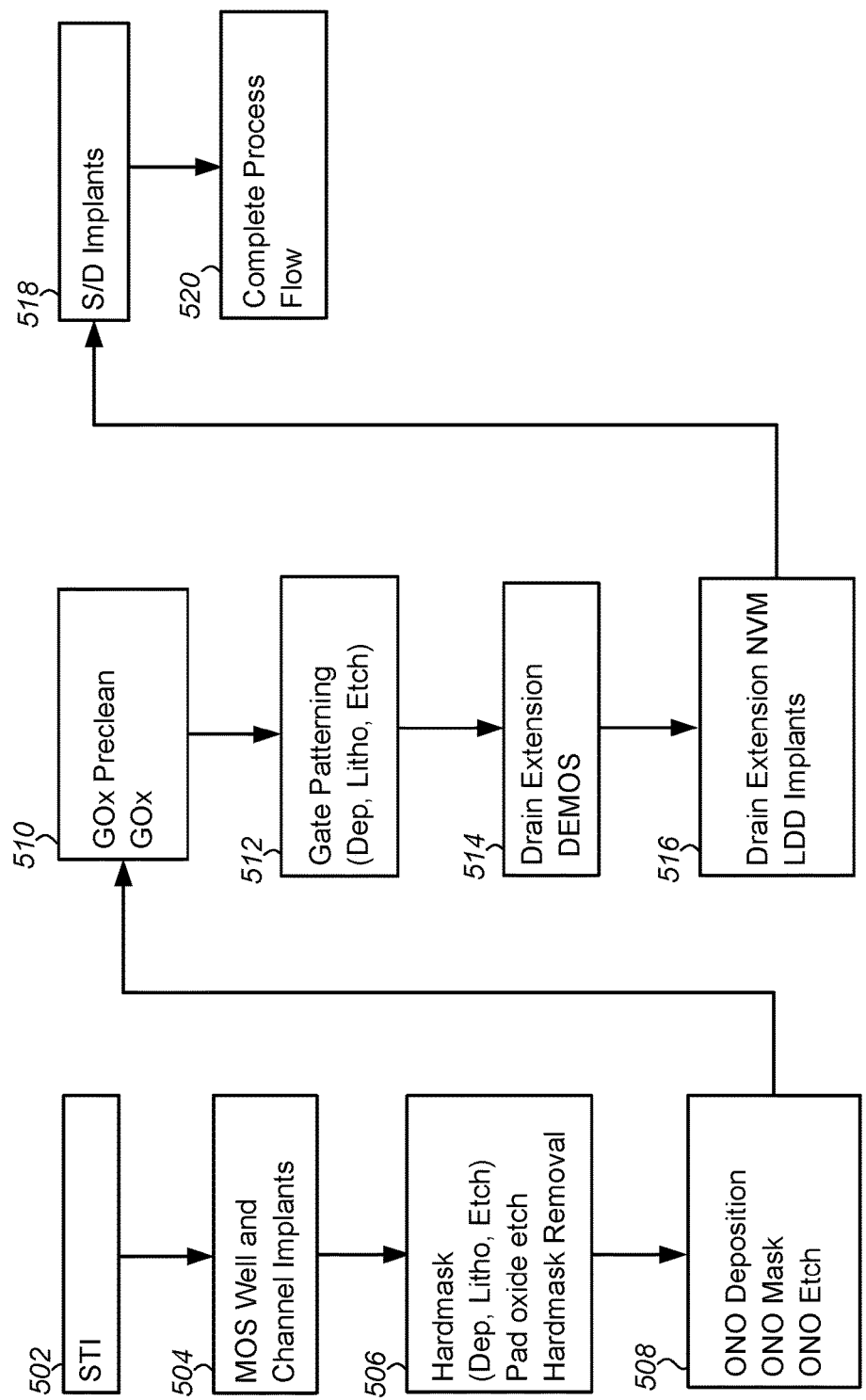
FIG. 5 is a flowchart illustrating an embodiment of a method for fabricating a circuit including a non-volatile memory (NVM) transistor, a low voltage metal-oxide-semiconductor (LV_MOS) transistor and a drain-extended P-type MOS (DEPMOS) transistor using a separate implant step according to an embodiment of the present disclosure.

An embodiment of a method for fabricating drain-extended metal-oxide-semiconductor (DEMOS) transistors having a multi-well and/or split channel architecture will now be described in detail with reference to FIG. 5 and FIGS. 6A through 6K. FIG. 5 is a flowchart illustrating an embodiment of a method or process flow for fabricating a memory or circuit including a non-volatile memory (NVM) transistor, a metal-oxide-semiconductor (MOS) transistor and a DEMOS transistor using a separate implant step to form the drain extension. FIGS. 6A through 6K are block diagrams illustrating cross-sectional views of a part of the circuit or memory cell 600 formed by the method of the flowchart of FIG. 5. Generally, the DEMOS transistor can be fabricated with little to no impact on an existing CMOS process flow used to fabricate a NVM transistor and/or other MOS transistors (not shown in these figures). The NVM transistor may include memory transistors using Silicon-Oxide-Nitride-Oxide-Silicon (SONOS) or Metal-Oxide-Nitride-Oxide-Silicon (MONOS) technology.

Referring to FIG. 5 and FIG. 6A, the process begins with forming a number of isolation structures 602 in a wafer or substrate 604 (step 502). The isolation structures 602 isolate the memory cell being formed from other memory cells formed in adjoining areas (not shown) of the substrate 604 and/or isolate the NVM transistor being formed in an NVM region 608 of the substrate from one or more MOS transistors, including the DEMOS transistor of the present disclosure, being formed in one or more adjoining MOS regions 612. The isolation structures 602 include a dielectric material, such as an oxide or nitride, and may be formed by any conventional technique, including but not limited to shallow trench isolation (STI) or local oxidation of silicon (LOCOS).

The substrate 604 may be a bulk wafer composed of any single crystal or polycrystalline material suitable for semiconductor device fabrication, or may include a top epitaxial layer of a suitable material formed on a substrate. Suitable materials include, but are not limited to, silicon, germanium, silicon-germanium or a III-V compound semiconductor material.

A pad oxide 614 is formed over a surface 616 of the substrate 604 in both the NVM region 608 and the MOS region 612. The pad oxide 614 can be silicon dioxide ($SiO_2$) having a thickness of from about 10 nanometers (nm) to about 20 nm and can be grown by a thermal oxidation process or in-situ steam generation (ISSG).

Referring again to FIG. 5 and FIG. 6B, dopants are then implanted into substrate 604 through the pad oxide 614 to form a lightly doped deep well (DWELL 618), a more heavily doped well (WELL 620) doped with the same type of dopant as the DWELL, and channels 622 and 624 for the NVM transistor and the DEMOS transistor that will be formed in the NVM region 608 and MOS region 612 (step 504). Generally, this involves several separate deposition, lithography, implant and stripping processes to implant wells and channels for different types of devices, formed in different areas, i.e., the core or I/O circuit of the NVM region 608 and the MOS region 612.

To form the DWELL 618 a photoresist layer is deposited and patterned using standard lithographic techniques to expose the MOS region 612 and an appropriate ion species implanted at an appropriate energy and concentration. For example, to form the DWELL 618 of a P-type DEMOS (DEPMOS) transistor in the MOS region 612, arsenic or phosphorous ions can be implanted at an energy of from about 800 to about 1,500 kilo-electron volts (keV), and a dose of from about $0.5E13$ $cm^2$ to about $5E13/cm^2$ to form a deep well. A DWELL 618 of a N-type DEMOS (DENMOS) transistor may likewise be formed by implantation of boron or $BF_2$ ions at a suitable dose and energy. Optionally, as in the embodiment shown, the DWELL 618 may be concurrently formed in the NVM region 608 and/or in other MOS regions (not shown).

Next, channels 622 and 624 for the NVM transistor and the DEMOS transistor are formed. The channels 622 and 624 can be formed immediately following or preceding the formation of the DWELL 618 using the same mask used for forming the DWELL, or a using separate mask formed using standard lithographic techniques as described above. The channels 622 and 624 are then formed by implanting an appropriate ion species at an appropriate energy to an appropriate concentration. For example, to perform implants of a P-type DEMOS (DEPMOS) transistor boron or $BF_2$ ions can be implanted at an energy of from about 10 to about 100 kilo-electron volts (keV), and a dose of from about $1E12/cm^2$ to about $1E14/cm^2$. Similarly, a N-type DEMOS (DENMOS) transistor may likewise be formed by implantation of arsenic or phosphorous ions at a suitable dose and energy. It is to be understood that implantation can be used to form channels, in both the MOS region 612 and in the NVM region 608 at the same time, or at separate times using standard lithographic techniques, including a patterned photoresist layer to mask one of the MOS regions.

Following the implant of the DWELL 618, and either before or after the implants forming the channels 622 and 624 for the NVM transistor and the DEMOS transistor, the WELL 620 is formed by implanting an appropriate ion species at an appropriate energy and concentration. For example, to form the WELL 620 of a P-type DEMOS (DEPMOS) transistor in the MOS region 612, arsenic or phosphorous ions can be implanted at an energy of from about 250 to about 500 kilo-electron volts (keV), and a dose of from about $1E13/cm^2$ to about $7E13/cm^2$ to form an NWELL. A WELL 620 of a N-type DEMOS (DENMOS) transistor may likewise be formed by implantation of boron or $BF_2$ ions at a suitable dose and energy.

In the embodiment shown in FIG. 6B, and described above, following the WELL and channel implants, the channel 624 for the DEMOS to be formed in the MOS region 612 includes a first channel 624a encompassed by or within the WELL 620 and a second channel 624b encompassed solely by or within the DNWELL 618.

After the implants have been performed, any remaining photoresist (PR) or mask is stripped either in an ashing process using oxygen plasma, or in a photoresist strip using a commercially available strip or solvent.

Figure 6C:
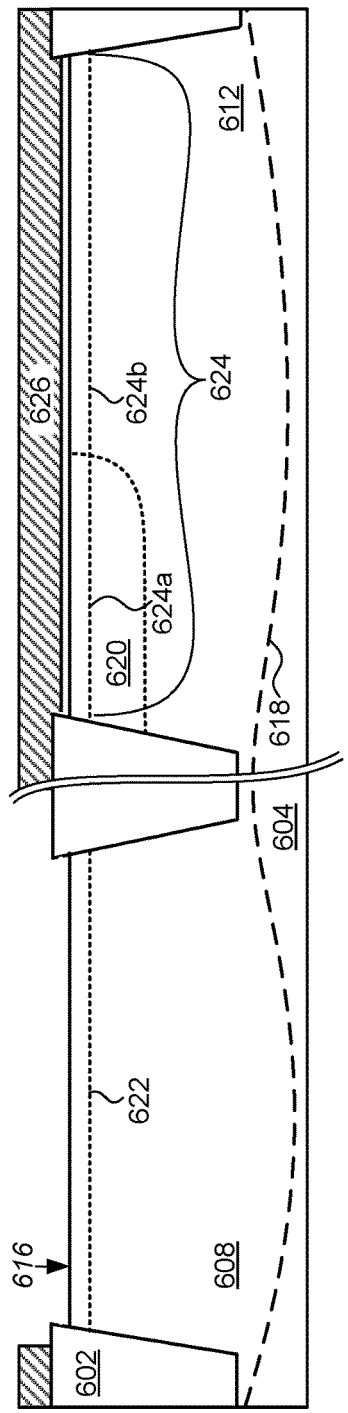
Figure 6D:
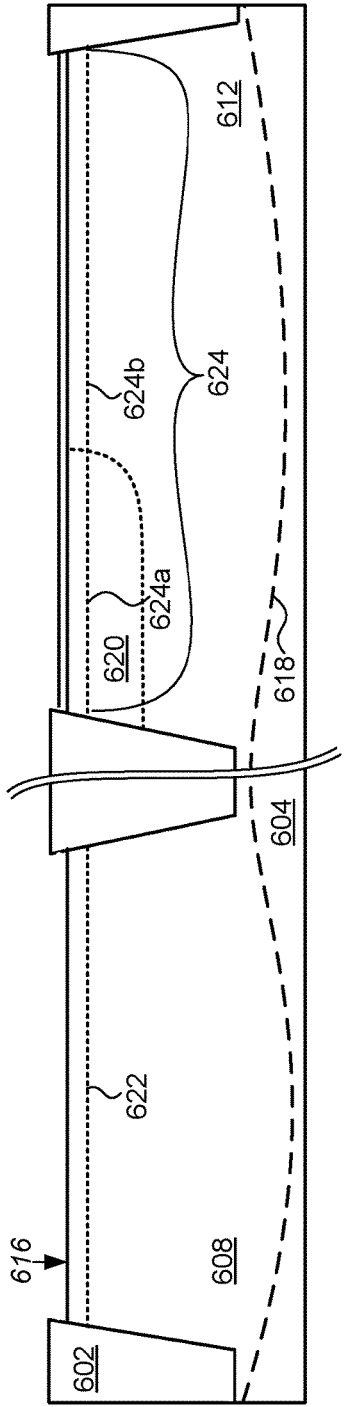

Next, referring to FIG. 5 and FIGS. 6C-6D a hardmask (HM) 626 is deposited and patterned to expose the surface 616 of the substrate 604 in the NVM region 608, the pad oxide 614 in the NVM region removed and the HM removed (step 506). The HM 626 can include one or more layers of material that can be patterned or opened using photoresist and standard lithographic techniques, but which is not itself photosensitive and protects underlying surface and structures formed therein from the photoresist and lithographic processes as well as from implants and etch process performed through openings formed in the hardmask. Suitable materials for the HM 626 include, for example, a layer of from about 5 to about 20 nm of silicon nitride ($Si_xN_y$), or silicon oxynitride (SiON) deposited by any known nitride deposition process. A photoresist layer (not shown), commonly referred to as a tunnel mask or TUNM is formed over substantially an entire surface of the HM 626 and patterned using standard lithographic techniques. The exposed part of the HM 626 is etched or removed using any suitable wet or dry etching technique, depending on the material of the hardmask and the underlying structures or layers. For example, in those embodiments in which the HM 626 includes a layer of silicon nitride overlying a pad oxide 614, the HM can be etched using a standard low pressure nitride etch at a moderate power (about 500 W) in a plasma of a fluorine containing gas, such as $CF_4$, or $CHF_3$, which exhibits good selectivity to silicon oxides, such as the silicon dioxide (SiO2) of the underlying pad oxide and/or the STI 602 structures.

Next, the pad oxide 614 over the NVM region 608 is removed or etched as shown in FIG. 6C. The etch can be accomplished, for example, in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Referring to FIG. 6D, the HM 626 is substantially entirely stripped or removed. The HM 626 can be removed using the same process and chemistry previously used to form openings in the hardmask. Alternatively, the silicon nitride can also be removed by a wet etch using Phosphoric acid ($H_3PO_4$) at a temperature of about 150° C. to 160° C.

Figure 6E:
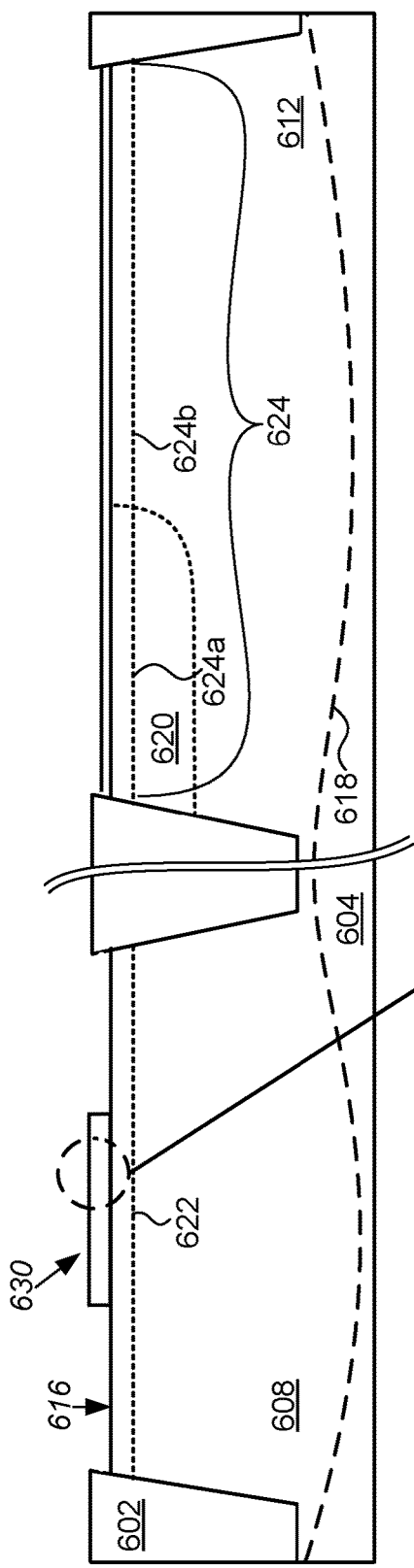
Figure 6F:
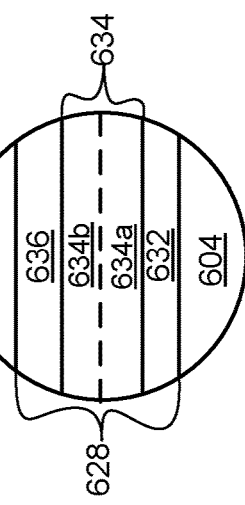

Referring to FIG. 5 and FIGS. 6E and 6F, a number of dielectric or oxide-nitride-oxide (ONO) layers, shown collectively as dielectric layers 628 in FIG. 6F, are formed or deposited over the surface 616 of the substrate 604, a mask (not shown) formed on or overlying the dielectric layers, and the dielectric layers etched to form ONO or dielectric stacks 630 of the NVM transistor to be formed in the NVM region 608 (step 508).

Referring to FIG. 6F, the number of dielectric layers 628 includes a tunneling layer 632 overlying the surface 616 of the substrate 604, a charge-trapping layer 634 overlying the tunneling layer and a blocking layer 636 overlying the charge-trapping layer. The tunneling layer 632 may be any material and have any thickness suitable to allow charge carriers to tunnel into an overlying charge-trapping layer under an applied gate bias while maintaining a suitable barrier to leakage when the NVM transistor is unbiased. In certain embodiments, tunneling layer 632 is silicon dioxide, silicon oxy-nitride, or a combination thereof and can be grown by a thermal oxidation process, using ISSG or radical oxidation, and having a thickness of from about 1.0 nanometers (nm) to about 3.0 nm by oxidation and consumption of the exposed surface of substrate.

Referring again to FIG. 6F, a charge-trapping layer 634 is formed on or overlying the tunneling layer 632. Generally, as in the embodiment shown, the charge-trapping layer is a multilayer charge-trapping layer having multiple layers including at least an oxygen-rich, substantially charge trap free lower or first charge-trapping layer 634a closer to the tunneling layer 632, and an upper or second charge-trapping layer 634b that is silicon-rich and oxygen-lean relative to the first charge-trapping layer and comprises a majority of a charge traps distributed in multilayer charge-trapping layer.

The first charge-trapping layer 634a of a multilayer charge-trapping layer 634 can include a silicon nitride ($Si_3N_4$), silicon-rich silicon nitride or a silicon oxy-nitride ($SiO_xN_y$). For example, the first charge-trapping layer 634a can include a silicon oxynitride layer having a thickness of between about 1.5 nm and about 4.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 634b of the multilayer charge-trapping layer is then formed over the first charge-trapping layer 634a. The second charge-trapping layer 634b can include a silicon nitride and silicon oxynitride layer having a stoichiometric composition of oxygen, nitrogen and/or silicon different from that of the first charge-trapping layer 634a. The second charge-trapping layer 634b can include a silicon oxynitride layer having a thickness of between about 2.0 nm and about 10.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher wt. % of silicon and oxygen (i.e. reduction of nitrogen). An oxygen-rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher wt. % of silicon with less oxygen than an "oxygen-rich" film. A silicon-rich silicon oxynitride film is therefore more like silicon and the RI is increased toward the 3.5 RI of pure silicon.

Referring again to FIG. 6F, the number of dielectric layers further includes a blocking dielectric layer or blocking layer 636 that is formed on or overlying the charge-trapping layer 634. In one embodiment, the blocking layer 636 can include an oxidized part of the silicon nitride of the underlying second charge-trapping layer 634b, which is subsequently oxidized by in-situ-steam-generation (ISSG), or radical oxidation to form the blocking layer 636. In other embodiments, the blocking layer 636 can include a silicon oxide ($SiO_2$) or a silicon oxynitride (SiON), deposited by CVD, and performed in a batch or single substrate processing chamber with or without an ignition event such as plasma. In one embodiment, the blocking layer 636 can include a silicon nitride, a silicon-rich silicon nitride or a silicon-rich silicon oxynitride layer having a thickness of between 2.0 nm and 4.0 nm formed by a CVD process using $N_2O$/$NH_3$ and DCS/$NH_3$ gas mixtures.

Figure 6G:
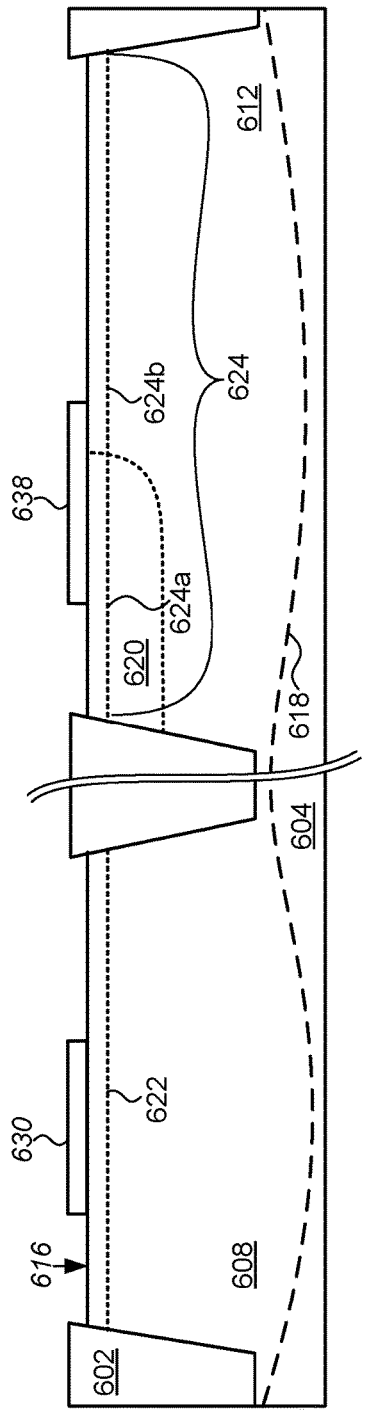

Referring to FIGS. 5 and 6G, a gate oxide or GOX preclean is performed, and a gate oxide 638 formed for the DEMOS transistor to be formed in the MOS region 612 (step 510). Referring to FIG. 6G, the GOX preclean removes the remaining pad oxides 614 in the MOS region 612 in a highly selective cleaning process. This cleaning process prepares the substrate 604 in the MOS region 612 for gate oxide growth. In one exemplary implementation the pad oxide 614 is removed in a wet clean process. Alternatively, the wet clean process can be performed using a 20:1 BOE wet etch, a 50:1 hydrofluoric (HF) wet etch, a pad etch, or any other similar hydrofluoric-based wet etching chemistry. In other embodiments, the cleaning process chemistry is chosen so as to remove only a negligible portion of the blocking layer 636 of the dielectric stack 630.

In one embodiment, the oxidation process to form gate oxide 638 involves forming a thick oxide over substantially all of the MOS region 612, using any known oxidation process in accordance with the methods described herein, forming a patterned photoresist mask using standard lithographic techniques and etching the oxide using a 10:1 buffered oxide etch (BOE), after which the photoresist mask is stripped or removed. The gate oxide 638 can have a thickness from about 1 nm to about 7 nm.

Figure 6H:
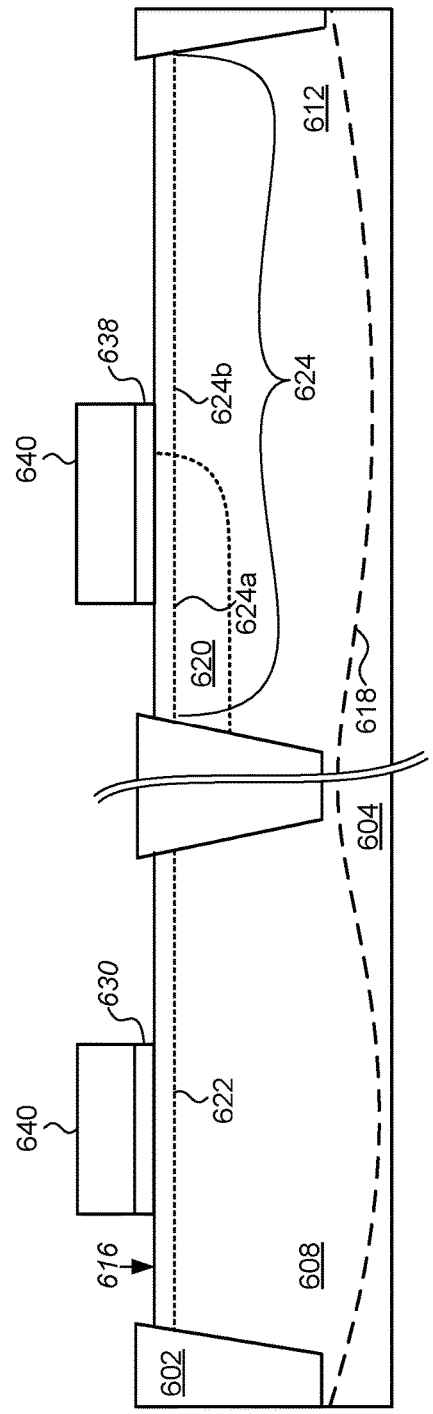

Referring to FIGS. 5 and 6H, a gate layer (not shown) is deposited and patterned to concurrently form gates 640 for the DEMOS transistor, and the NVM transistor (step 512). Generally, the gate layer is a conductive, conformal layer deposited over substantially the entire surface 616 of the substrate 604 and all layers and structures formed thereon. A patterned photoresist mask (not shown) is then formed using standard lithographic techniques and the gate layer etched to remove the gate layer from areas not protected by the mask.

In one embodiment, the gate layer includes a doped polysilicon or poly layer deposited using chemical vapor deposition (CVD) to a thickness of from about 30 nm to about 100 nm, and etched using standard polysilicon etch chemistries, such as $CHF_3$ or $C_2H_2$ or $HBr/O_2$ which are highly selective to the underlying material of the gate oxide 638 and the dielectric stack 630. The polysilicon can be doped using phosphorus implant for NMOS and boron implant for PMOS transistors. The implant doses are in the range of 1E15 to 1E16/$cm^2$ at energies of 2 to 50 keV.

Next, referring to FIGS. 5 and 6I in accordance with the present disclosure a drain extension 642 is formed in the MOS region 612 adjacent to where a drain for a DEMOS transistor will be formed by implanting or diffusing ions 644 of the appropriate dopant species to a suitable concentration and a suitable depth (step 514). For example, the drain extension 642 can be formed by implanting $BF_2$ ions ($BF_2^+$) or boron ions 644 at an energy of from about 20 to about 50 keV, to a concentration of from about 0.5E13 to about 5E13/cm$^2$. In some embodiments, such as that shown, the drain extension implant can be angled relative to the surface 616 of the substrate 604 in such a way that the drain extension 642, overlaps the gate stack 638/640 of the DEMOS. Suitable distances or lengths for the overlap include from about 30 to about 80 nm. In certain embodiments, such as that shown in FIG. 6I, the drain extension implant can split the second channel 624b into a first portion 624$b_1$ encompassed by or within only the DNWELL 612 and a second portion 624$b_2$ encompassed by or within the drain extension 642 in the DNWELL.

Referring to FIGS. 5 and 6J, optionally in some embodiments another or second drain extension 646 can be formed in the NVM region 608 adjacent to where a drain for a NVM transistor will be formed, and lightly doped diffusion (LDD) regions 648 can be formed in one or both of the MOS region 612 and the NVM region adjacent to where sources for the DEMOS transistor 650 and NVM transistor 652 will be formed (step 516). As with the drain extension 642 for the DEMOS transistor the drain extension 646 for the NVM transistor can be formed by implanting or diffusing ions of the appropriate species and energy to the appropriate concentration.

For example, the drain extension 646 for the NVM transistor can be formed by implanting or diffusing phosphorus ions ($P^+$) at an energy of from about 4 to about 10 keV, to a concentration of from about 3E13 to about 3E14/cm$^2$.

Figure 6K:
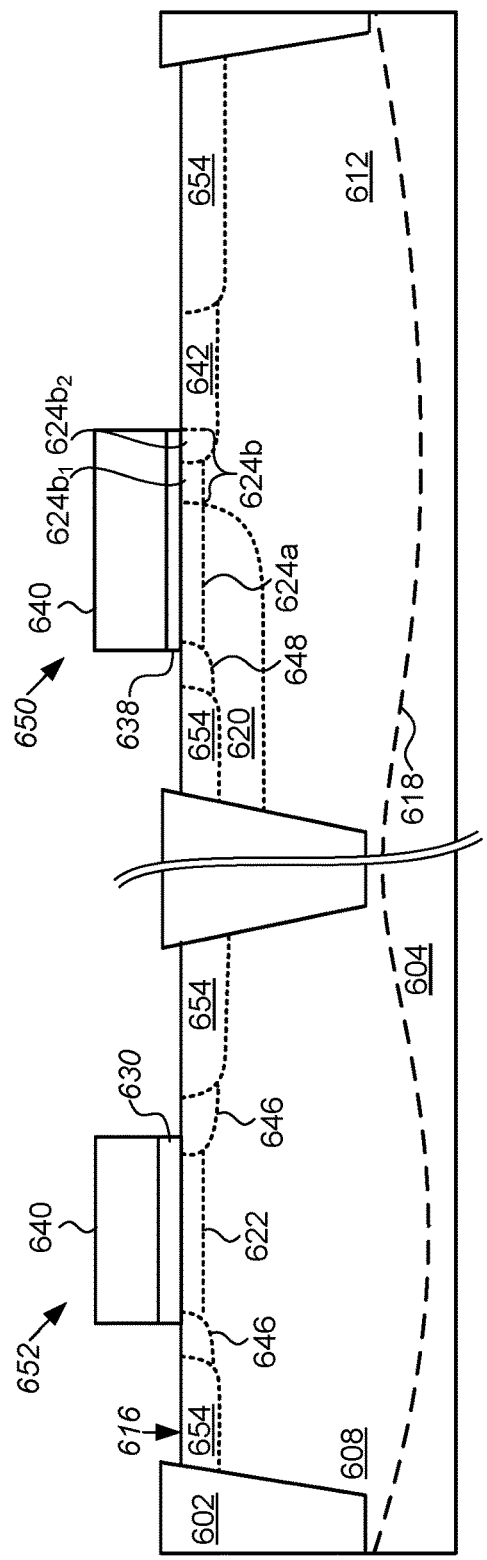

Similarly, the LDD regions 648 can include a concentration of $BF_2$ ions ($BF_2^+$) of from about 0.5E14 to about 5E14/cm$^2$, as compared to the dopant concentration in highly doped source, and can extend from edge of the gate stacks or the beginning of the channels 622 and 624 for the NVM transistor and the DEMOS transistor to the sources distance or length of from about 20 to about 80 nm. Additionally, as with the drain extension 642 and 646 in some embodiments the LDD 648 can overlap the gate stacks as shown in FIG. 6K, while in other embodiments it is formed in such a way as to end at the edge of the gate stacks or the beginning of the channels.

Referring again to FIGS. 5 and 6K, a patterned mask (not shown) is formed and source and drain (S/D) implants are performed to form source and drain (S/D) regions 654 for both the DEMOS transistor 650 and NVM transistor 652 (step 518). The patterned mask can include a photoresist mask or a hardmask patterned to expose only the S/D regions the DEMOS transistor 650 and NVM transistor 652. S/D regions 654 can be formed by implanting or diffusing ions of the appropriate species and energy to the appropriate concentration. For example, the S/D regions 654 for a P-type DEMOS transistor 650 and NVM transistor 652 can be formed by implanting or diffusing boron ions ($B^+$) or $BF_2$ ions at an energy of from about 2 to about 10 keV, to a concentration of from about 1E15 to about 1E16/cm$^2$.

After the S/D implants have been performed, the standard or baseline CMOS process flow is continued to substantially complete the front end fabrication for both the DEMOS transistor 650 and NVM transistor 652 (step 520). The CMOS process flow can include spacer deposition, etch and silicidation to form contacts to the S/D regions 654, and the formation of one or more interlayer dielectrics (ILD) as well as local interconnects between devices and transistors on a single level and vertical or interlayer contacts or vias.

Figure 7:
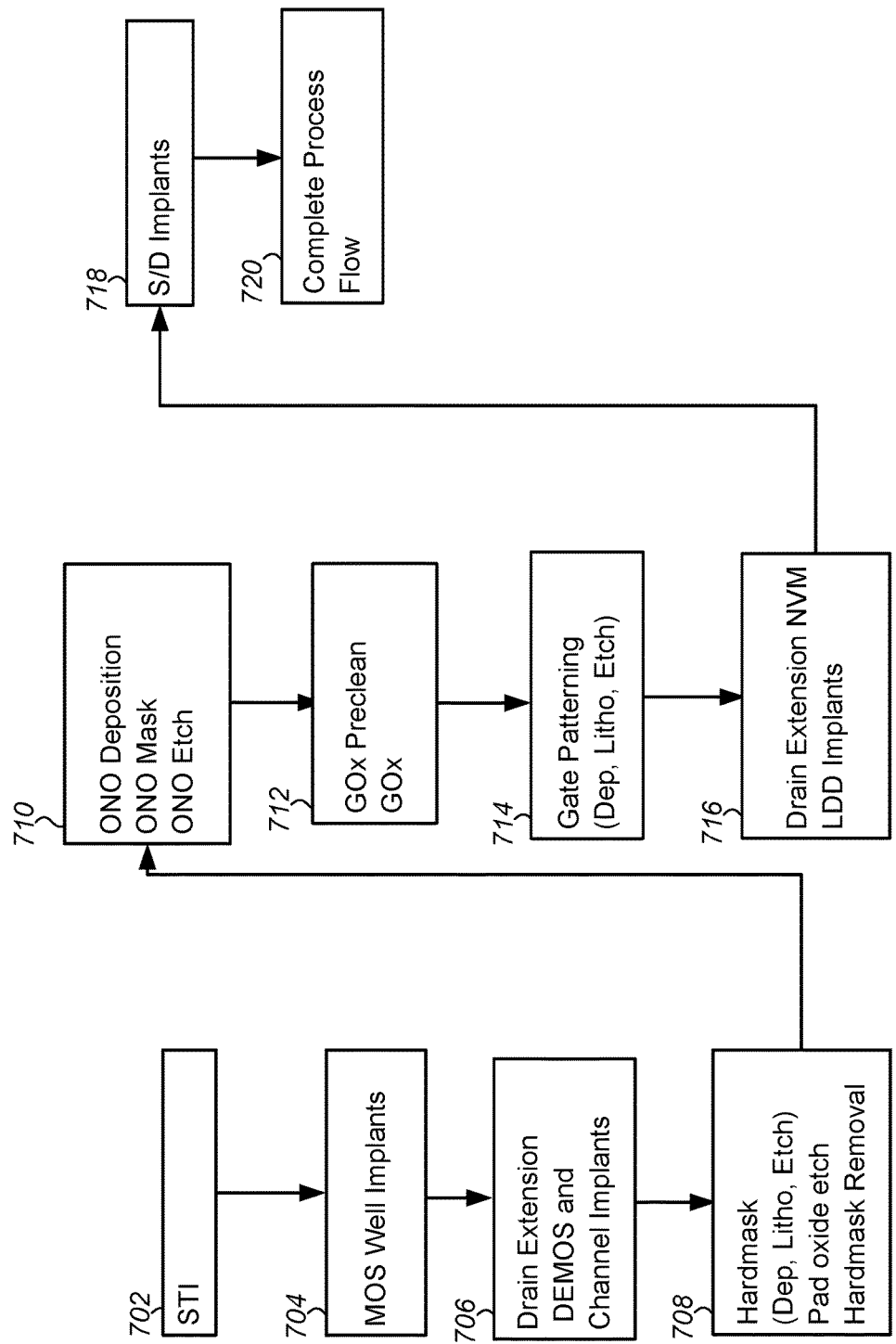
FIG. 7 is a flowchart illustrating a method for fabricating a circuit including a NVM transistor and a DEMOS transistor using a single implant to concurrently form a channel region and a drain extension for the DEMOS transistor according to another embodiment of the present disclosure.

In an alternative to the embodiment of FIG. 5, a step of forming the channel for either or both of the DEMOS transistor and the NVM transistor can be performed concurrently with a step of forming the drain extension for the DEMOS transistor. More particularly, a MOS channel region for the DEMOS transistor, including both first and the second channels, can be formed concurrently with an implant to form a MOS drain extension using a single implant, such as threshold voltage ($V_T$) implant, so that the MOS channel region and MOS drain extension include dopants of the same conductivity-type and concentration. An embodiment of this method will now be described with reference to FIG. 7. FIG. 7 is a flowchart illustrating an embodiment of a method for fabricating a circuit including a NVM transistor and a DEMOS transistor using a single implant to concurrently form a channel region and a drain extension for the DEMOS transistor.

Referring to FIG. 7, the process begins with forming a number of isolation structures in a wafer or substrate (step 702). The isolation structures isolate a NVM transistor being formed in an NVM region of the substrate from the DEMOS transistor being formed in one or more adjoining MOS regions. A pad oxide is formed over a surface of the substrate in both the NVM region and the MOS region. The isolation structures are formed in substantially the same manner as that described above in connection with step 502.

Next, dopants are then implanted into substrate through the pad oxide to form a lightly doped deep well (DWELL), a more heavily doped well (WELL) doped with the same type of dopant as the DWELL for the NVM transistor and the DEMOS transistor that will be formed in the NVM region and MOS regions (step 704). The DWELL and WELL are formed in substantially the same manner as that described above in connection with step 504.

In accordance with this embodiment a single implant is performed to concurrently form a channel region and a drain extension for the DEMOS transistor (step 706). For example, the drain extension and channel region can be formed by implanting $BF_2$ ions ($BF_2^+$) or boron ions at an energy of from about 20 to about 50 keV, to a concentration of from about 0.5E13 to about 5E13/cm$^2$. In some embodiments, such as that shown, the drain extension implant can be angled relative to the surface of the substrate in such a way that the drain extension overlaps the gate stack of the DEMOS. Suitable distances or lengths for the overlap include from about 30 to about 80 nm. In certain embodiments, the drain extension implant can split the second channel into a first portion encompassed by or within only the DNWELL and a second portion encompassed by or within the drain extension in the DNWELL.

Next, a hardmask is deposited and patterned to expose the surface of the substrate in the NVM region, the pad oxide in the NVM region removed and the hardmask removed (step 708). The deposition, patterning and removal of the hardmask and the pad oxide is accomplished in substantially the same manner as that described above in connection with step 506.

A number of dielectric or ONO layers are formed or deposited over the surface of the substrate, a mask formed on or overlying the dielectric layers, and the dielectric layers etched to form an ONO stacks of the NVM transistor to be formed in the NVM region (step 710). The deposition and patterning removal of the dielectric layers is accomplished in the same manner as that described in connection with step 508 above. A gate oxide or GOX preclean is performed, and a gate oxide formed for the DEMOS transistor to be formed in the MOS region (step 712). The GOX preclean and deposition and patterning of the gate oxide and is accomplished in substantially the same manner as that described above in connection with step 510.

Next, a gate layer is deposited and patterned to concurrently form a gates for the NVM and DEMOS transistor (step 714). The deposition and patterning of the gate layer is accomplished in substantially the same manner as that described above in connection with step 512.

LDD regions are formed between the source and channel of the DEMOS transistor and NVM transistor, and, optionally, a second drain extension formed between the drain of the NVM transistor and channel (step 716) as described above in connection with step 516. A patterned mask is formed and source and drain (S/D) implants are performed to form source and drain (S/D) regions for the DEMOS transistor and NVM transistor (step 718). The formation of the S/D regions is accomplished in substantially the same manner as that described above in connection with step 518. The standard or baseline CMOS process flow is then continued to substantially complete the front end fabrication the DEMOS transistor and NVM transistor (step 720) in substantially the same manner as that described above in connection with step 520.

In another embodiment, the drain extension of a DEMOS transistor according to the present disclosure can be formed concurrently in a single implant with an existing ESD implant step to form an electro-static discharge (ESD) diffusion region of an ESD device or circuit in a standard CMOS process flow.

Figure 8:
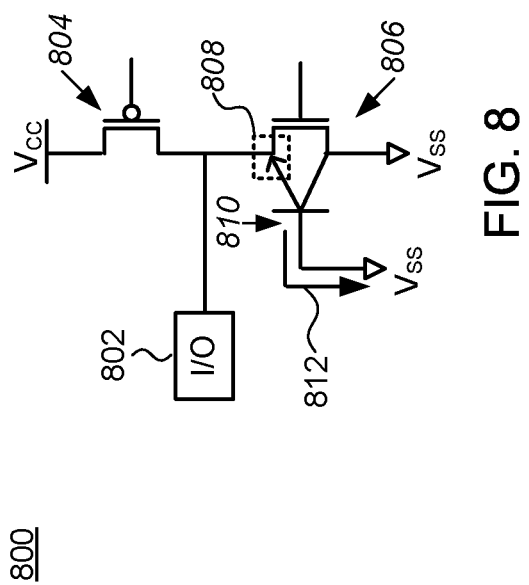
FIG. 8 is a schematic diagram of an embodiment of an electro-static discharge (ESD) protection circuit showing a discharge path for an ESD pulse through an ESD implant surrounding a drain of an ESD transistor.

Referring to FIG. 8, ESD protection device or circuit 800 protects circuits of an IC, such as the circuit or memory cell 600 described above, from voltage pulses or spikes generated or applied to I/O pads 802 of the circuit during normal operation due buildup of static electric charges. Referring to FIG. 8 an exemplary ESD protection circuit includes a first MOS transistor 804 or a first or P-type with a source coupled to a $V_{CC}$ pin of the IC and a drain coupled to the I/O pad 802 and to a second MOS transistor 806 of a second or N-type. The second MOS transistor 806 includes a drain coupled to the I/O pad 802 and a source coupled to a $V_{SS}$ pin of the IC. A deep P-type ESD implant 808 under the drain of second MOS transistor 806 reduces a drain junction breakdown voltage of the transistor. When an ESD pulse that is positive with respect to $V_{SS}$ is applied to the I/O pad 802 the drain junction breaks down earlier than other devices in the circuit triggering a parasitic bulk bipolar transistor 810 associated with the second MOS transistor, providing a current path 812 through a bulk of the transistor to $V_{SS}$.

Figure 9:
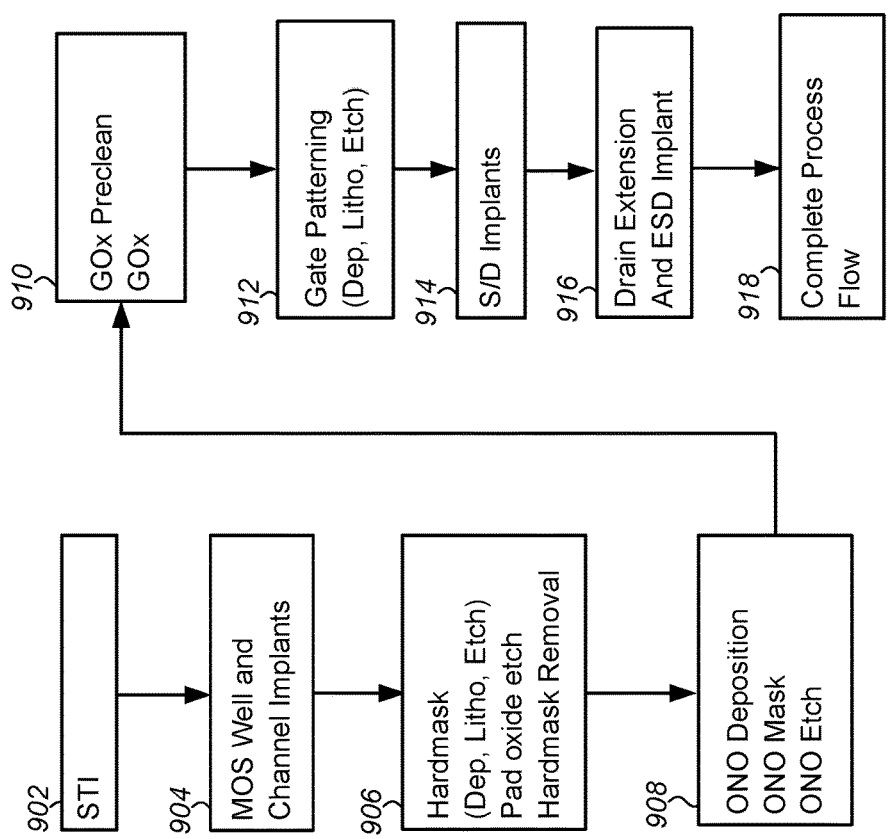
FIG. 9 is a flowchart illustrating an embodiment of a method for fabricating a circuit including a NVM transistor, a MOS transistor in an electrostatic discharge (ESD) circuit and a DEMOS transistor using an existing ESD implant step in the CMOS process flow.

An embodiment of a method for fabricating DEMOS transistors having a multi-well and/or split channel architecture using an existing ESD implant will now be described in detail with reference to FIG. 9 and FIGS. 10A through 10D. FIG. 9 is a flowchart illustrating an embodiment of a method for fabricating a circuit including a NVM transistor, a MOS transistor in an ESD circuit and a DEMOS transistor using an existing ESD implant step in the CMOS process flow. FIGS. 10A through 10D are block diagrams illustrating cross-sectional views of a part of the circuit or memory cell 1000 formed by the method of the flowchart of FIG. 9.

Referring to FIG. 9 and FIG. 10A, the process begins with forming a number of isolation structures 1002 in a wafer or substrate 1004 (step 902). The isolation structures 1002 isolate a NVM transistor being formed in an NVM region 1006 of the substrate from the DEMOS transistor and ESD transistor being formed in one or more adjoining MOS regions 1008 and 1010. A pad oxide 1014 is formed over a surface 1016 of the substrate 1004 in both the NVM region 1006 and the MOS regions 1008 and 1010.

Referring again to FIG. 9 and FIG. 10B, dopants are then implanted into substrate 1004 through the pad oxide 1014 to form a lightly doped deep well (DWELL 1018), a more heavily doped well (WELL 1020) doped with the same type of dopant as the DWELL, and channels 1022, 1024a, 1024b and 1025 for the NVM transistor, the DEMOS transistor and the ESD transistor that will be formed in the NVM region 1006 and MOS regions 1008 and 1010 (step 904).

Next, referring to FIG. 9 and FIG. 10B, a hardmask is deposited and patterned to expose the surface 1016 of the substrate 1004 in the NVM region 1006, the pad oxide 1014 in the NVM region removed and the hardmask removed (step 906). The deposition, patterning and removal of the hardmask and the pad oxide 1016 is accomplished in the same manner as that described in connection with step 506 above.

A number of dielectric or ONO layers are formed or deposited over the surface 1016 of the substrate 1004, a mask formed on or overlying the dielectric layers, and the dielectric layers etched to form an ONO stacks of the NVM transistor to be formed in the NVM region 1006 (step 908). The deposition and patterning removal of the dielectric layers is accomplished in the same manner as that described in connection with step 508 above.

Next, referring to FIG. 9 and FIG. 10C, a gate oxide or GOX preclean is performed, and a gate oxides 1030, 1038 and 1039 formed for the NVM transistor, the DEMOS transistor and the ESD transistor to be formed in the MOS regions 1008 and 1010 (step 910). The GOX preclean and deposition and patterning of the gate oxides 1038 and 1039 is accomplished in the same manner as that described in connection with step 510 above.

A gate layer is deposited and patterned to concurrently form gates 1040 for the NVM transistor, the DEMOS transistor and the ESD transistor (step 912). The deposition and patterning of the gate layer 1040 is accomplished in the same manner as that described in connection with step 512 above.

Referring again to FIGS. 9 and 10C, a patterned mask (not shown) is formed and source and drain (S/D) implants are performed to form source and drain (S/D) regions 1054 for the DEMOS transistor 1050, ESD transistor 1051 and NVM transistor 1052 (step 914).

Referring again to FIG. 9 and FIG. 10D, in accordance with the present disclosure a drain extension 1042 is formed in the MOS region 1008 adjacent to where a drain for a DEMOS transistor will be formed concurrent with an ESD diffusion region 1043 of the ESD transistor by implanting or diffusing ions 1044 of the appropriate dopant species to a suitable concentration and a suitable depth (step 914). For example, the drain extension 1042 and ESD diffusion region 1043 can be formed by implanting boron ions ($B^+$) ions 1044 at an energy of from about 40 to about 100 keV, to a concentration of from about 1E13 to about $1E14/cm^2$. In some embodiments, such as that shown, the drain extension implant can be angled relative to the surface 1016 of the substrate 1004 in such a way that the drain extension 1042, overlaps the gate stack 1038/1040 of the DEMOS. Suitable distances or lengths for the overlap include from about 20 to about 80 nm.

The standard or baseline CMOS process flow is then continued to substantially complete the front end fabrication the DEMOS transistor, ESD transistor and NVM transistor (step 918). The S/D implants and deposition and completion of the baseline CMOS process flow is accomplished in the same manner as that described in connection with steps 518 and 520 above.

Although not shown or described in connection with this embodiment, it will be understood that the method can further include the formation of LDD regions between the source and channel of the DEMOS transistor 1050, ESD transistor 1051 and NVM transistor 1052, and a second drain extension between the drain of the NVM transistor and channel as described in connection with steps 514 and 516 above.

Thus, embodiments of drain-extended metal-oxide-semiconductor (DEMOS) transistors and methods for fabricating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A method comprising:
   forming a deep well (DWELL) in a first region of a substrate, the DWELL extending throughout the entire first region;
   forming a well surrounded by the DWELL, the well adjacent a surface of the substrate and extending over less than the entire first region so that an interface between the well and the DWELL and a portion of the DWELL are exposed on the surface of the substrate;
   forming in the first region a channel for a DEMOS transistor, the channel formed over the interface between the well and the DWELL and including a first channel formed in the well and a second channel formed in the DWELL;
   depositing and patterning a gate layer to concurrently form a first gate for the DEMOS transistor in the first region overlying the interface between the well and the DWELL and a second gate for an ESD device in a second region of the substrate; and
   implanting dopants at an acute angle relative to the surface of the substrate without the use of a mask in the first or the second region to form a drain extension to the first gate of the DEMOS transistor in the first region, and to concurrently form an ESD diffusion region in the second region in a single implant step, wherein the second channel is split into a first portion and a second portion in the drain extension extending under the first gate.

2. The method of claim 1 wherein doping in the second portion of the second channel is higher than doping in the first portion of the second channel.

3. The method of claim 1 wherein the well is doped with a same type of dopant as the DWELL.

4. The method of claim 3 wherein the well is heavily doped relative to the DWELL.

5. The method of claim 1 wherein a source and drain for the DEMOS transistor and a source and drain for the ESD device are of a different type from dopants used to form the well and the DWELL.

6. The method of claim 1 further comprising prior to forming the DWELL and the well, forming a number of isolation structures in the surface of the substrate to isolate the DEMOS transistor from the second region.

7. The method of claim 1 wherein the substrate further comprises a third region in which a non-volatile memory device is to be formed, and wherein forming the DWELL comprises concurrently forming the DWELL in the first region and in the third region.

8. A method comprising:
   forming a deep well (DWELL), and a well in a first region of a substrate, the DWELL extending throughout the entire first region and the well adjacent a surface of the substrate and extending over less than the entire first region so that an interface between the well and the DWELL and a portion of the DWELL are exposed on the surface of the substrate;
   forming in the first region a channel for a DEMOS transistor, the channel formed over the interface between the well and the DWELL and including a first channel formed in the well and a second channel formed in the DWELL;
   depositing and patterning a gate layer to concurrently form a first gate for the DEMOS transistor in the first region overlying the interface between the well and the DWELL and a second gate for an ESD device in a second region of the substrate;
   concurrently forming a source and drain (S/D) for the DEMOS transistor in the first region, and a S/D for the ESD device in the second region; and
   implanting dopants to form in the first region a drain extension extending from the drain of the DEMOS transistor to the first gate, and to concurrently form in the second region an ESD diffusion region in a single implant step without the use of a mask overlying any portion of the first region or the second region,
   wherein the well is doped with a same type of dopant as the DWELL and is heavily doped relative to the DWELL.

9. The method of claim 8 wherein the drain extension extends at least partially under the first gate into the second channel, and wherein the second channel is split into a first portion and a second portion in the drain extension extending under the first gate.

10. The method of claim 9 wherein doping in the second portion of the second channel is higher than doping in the first portion of the second channel.

11. The method of claim 9 wherein implanting dopants to form the drain extension and ESD diffusion region comprises implanting dopants at an acute angle relative to the surface of the substrate.

12. The method of claim 8 further comprising prior to forming the DWELL and the well, forming a number of isolation structures in the surface of the substrate to isolate the DEMOS transistor from the second region.

13. The method of claim 8 wherein the substrate further comprises a third region in which a non-volatile memory device is to be formed, and wherein forming the DWELL comprises concurrently forming the DWELL in the first region and in the third region.

14. A method comprising:
forming a number of isolation structures in a surface of a substrate to isolate a first region of the substrate from a second region;
forming in the first region a lightly doped deep well (DWELL) extending throughout the entire first region and a heavily doped well doped with a same type of dopant as the DWELL, the well formed in the DWELL adjacent to the surface of the substrate and extending over less than the entire first region so that an interface between the well and the DWELL and a portion of the DWELL are exposed on the surface of the substrate;
forming in the first region a channel for a DEMOS transistor, the channel formed over the interface between the well and the DWELL and including a first channel formed in the well and a second channel formed in the DWELL;
depositing and patterning a gate layer over the surface of the substrate to concurrently form a first gate for the DEMOS transistor in the first region overlying the interface between the well and the DWELL and a second gate for an ESD device in the second region; and
implanting dopants at an acute angle relative to the surface of the substrate to form a drain extension to the first gate of the DEMOS transistor in the first region, and to concurrently form an ESD diffusion region in the second region in a single implant step without the use of a mask overlying any portion of the DEMOS transistor or the ESD diffusion region, wherein the second channel is split into a first portion and a second portion in the drain extension extending under the first gate,
wherein the DWELL is implanted at a high energy relative to the well so that the well is enclosed within the DWELL.

15. The method of claim 14 wherein the substrate further comprises a third region in which a non-volatile memory device is to be formed, and wherein forming the DWELL comprises concurrently forming the DWELL in the first region and in the third region.

16. The method of claim 14 wherein the DWELL is implanted at an energy of about 800 keV and about 1.5 MeV, and the well is implanted at an energy of about 250 keV to about 500 keV.

* * * * *